United States Patent
Hai et al.

(10) Patent No.: US 11,875,595 B2
(45) Date of Patent: Jan. 16, 2024

(54) TEXTURE RECOGNITION APPARATUS AND ELECTRONIC APPARATUS

(71) Applicant: BOE TECHNOLOGY GROUP CO., LTD., Beijing (CN)

(72) Inventors: Xiaoquan Hai, Beijing (CN); Lei Wang, Beijing (CN); Xiaoliang Ding, Beijing (CN); Xue Dong, Beijing (CN); Xuan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/764,570

(22) PCT Filed: May 21, 2021

(86) PCT No.: PCT/CN2021/095075
§ 371 (c)(1),
(2) Date: Mar. 29, 2022

(87) PCT Pub. No.: WO2021/258941
PCT Pub. Date: Dec. 30, 2021

(65) Prior Publication Data
US 2022/0351539 A1  Nov. 3, 2022

(30) Foreign Application Priority Data

Jun. 22, 2020  (CN) .......................... 202010575661.2

(51) Int. Cl.
*G06V 40/13* (2022.01)
*G06V 40/12* (2022.01)
(Continued)

(52) U.S. Cl.
CPC ...... *G06V 40/1318* (2022.01); *G06V 40/1359* (2022.01); *H10K 59/122* (2023.02); *H10K 59/65* (2023.02)

(58) Field of Classification Search
None
See application file for complete search history.

(56) References Cited

U.S. PATENT DOCUMENTS

2017/0108672 A1   4/2017  Chang et al.
2018/0366593 A1* 12/2018  Huang .............. H01L 31/02327
(Continued)

FOREIGN PATENT DOCUMENTS

| CN | 106203412 A | 12/2016 |
| CN | 109151283 A | 1/2019 |
| CN | 110418044 A | 11/2019 |

*Primary Examiner* — Joseph R Haley
(74) *Attorney, Agent, or Firm* — Chiwin Law LLC

(57) ABSTRACT

A texture recognition apparatus and an electronic apparatus are provided. The texture recognition apparatus has a touch side surface, and includes a light source array, an image sensor array, and a light shielding layer. The light source array includes a plurality of light sources; the image sensor array includes a plurality of image sensors, each image sensor includes a photosensitive element; the light shielding layer is on a light incident side of the image sensor array, the light shielding layer includes a plurality of light-transmitting holes; the plurality of light-transmitting holes are configured to collimate light emitted by the plurality of light sources and reflected by the texture to a direction perpendicular to the touch side surface; and in the direction perpendicular to the touch side surface, a photosensitive element in each image sensor at least partially overlaps with at least one of the plurality of light-transmitting holes.

15 Claims, 10 Drawing Sheets

(51) Int. Cl.
*H10K 59/122* (2023.01)
*H10K 59/65* (2023.01)

(56) References Cited

U.S. PATENT DOCUMENTS

2020/0394371 A1* 12/2020 Chai .................. G06F 3/0416
2022/0173174 A1* 6/2022 Hatsumi ................ H10K 59/65
2022/0367582 A1* 11/2022 Wang .................... G06F 3/041

* cited by examiner

TEXTURE RECOGNITION APPARATUS AND ELECTRONIC APPARATUS

This application is a U.S. National Phase Entry of International Application No. PCT/CN2021/095075, filed on May 21, 2021, designating the United States of America and claiming priority to Chinese Patent Application No. 202010575661.2, filed on Jun. 22, 2020. The present application claims priority to and the benefit of the above-identified applications and the above-identified applications are incorporated by reference herein in their entirety.

TECHNICAL FIELD

Embodiments of the present disclosure relate to a texture recognition apparatus and an electronic apparatus.

BACKGROUND

With increasing popularity of mobile terminals, more and more users use the mobile terminals to perform operations such as identity verification and electronic payment. Due to uniqueness of skin texture, such as fingerprint patterns or palmprint patterns, a fingerprint recognition technology combined with optical imaging is gradually adopted by mobile electronic devices for identity verification, electronic payment, etc. How to design a more optimized texture recognition apparatus is a focus problem in the art.

SUMMARY

At least one embodiment of the present disclosure relates to a texture recognition apparatus, the texture recognition apparatus has a touch side surface, and comprises a light source array, an image sensor array, and a light shielding layer, the light source array comprises a plurality of light sources; the image sensor array comprises a plurality of image sensors, the plurality of image sensors are configured to be able to receive light emitted from the plurality of light sources and reflected by a texture to the plurality of image sensors for texture image collection, each of the plurality of image sensors comprises a photosensitive element; and the light shielding layer is on a light incident side of the image sensor array, the light shielding layer comprises a plurality of light-transmitting holes, the plurality of light-transmitting holes are configured to collimate light emitted by the plurality of light sources and reflected by the texture to a direction perpendicular to the touch side surface; in the direction perpendicular to the touch side surface, a photosensitive element in each of the plurality of image sensors at least partially overlaps with at least one of the plurality of light-transmitting holes.

For example, in the texture recognition apparatus provided by at least one embodiment of the present disclosure, the plurality of light-transmitting holes comprise a plurality of first light-transmitting holes arranged in an array; and the plurality of image sensors comprise a first image sensor, in the direction perpendicular to the touch side surface, a photosensitive element of the first image sensor at least partially overlaps with the plurality of first light-transmitting holes.

For example, in the texture recognition apparatus provided by at least one embodiment of the present disclosure, a value range of a diameter w of each of the plurality of first light-transmitting holes is 1 microns to 10 microns; and a value range of a height H of each of the plurality of first light-transmitting holes in the direction perpendicular to the touch side surface is 4 microns to 50 microns.

For example, in the texture recognition apparatus provided by at least one embodiment of the present disclosure, a value range of an aperture ratio H/w of each of the plurality of first light-transmitting holes is 1 to 10.

For example, in the texture recognition apparatus provided by at least one embodiment of the present disclosure, a separation distance between two adjacent light-transmitting holes of the plurality of first light-transmitting holes is 2 microns to 10 microns.

For example, in the texture recognition apparatus provided by at least one embodiment of the present disclosure, the light shielding layer comprises a plurality of light shielding patterns arranged in an array, in the direction perpendicular to the touch side surface, the plurality of light shielding patterns are in one-to-one correspondence and at least partially overlap with the plurality of image sensors; and the plurality of light-transmitting holes are distributed in the plurality of light shielding patterns.

For example, the texture recognition apparatus provided by at least one embodiment of the present disclosure further comprises a display panel, the display panel comprises an array substrate; the array substrate comprises a base substrate and a sub-pixel array on the base substrate; the sub-pixel array comprises a plurality of sub-pixels, the light source array comprises the sub-pixel array; and the plurality of light sources comprise the plurality of sub-pixels.

For example, in the texture recognition apparatus provided by at least one embodiment of the present disclosure, each of the plurality of sub-pixels comprises a pixel driving circuit on the base substrate, the pixel driving circuit comprises a thin film transistor; and each of the plurality of image sensors further comprises a switch transistor on the base substrate, the thin film transistor and the switch transistor are in a same layer.

For example, in the texture recognition apparatus provided by at least one embodiment of the present disclosure, the photosensitive element is on a side of the switch transistor away from the base substrate; the photosensitive element comprises a first electrode, a second electrode and a semiconductor layer between the first electrode and the second electrode; the first electrode is electrically connected with the switch transistor; the array substrate further comprises a planarization layer on a side of the photosensitive element away from the base substrate; and the planarization layer has a first via and a second via; each of the plurality of sub-pixels further comprises a light-emitting device; the light-emitting device is on a side of the planarization layer away from the base substrate; the light-emitting device comprises a first light-emitting electrode, a second light-emitting electrode, and a light-emitting layer between the first light-emitting electrode and the second light-emitting electrode; the first light-emitting electrode is electrically connected with the thin film transistor at least through the first via; the array substrate further comprises a connecting line in a same layer as the first light-emitting electrode; and the connecting line is electrically connected with the second electrode of the photosensitive element through the second via.

For example, in the texture recognition apparatus provided by at least one embodiment of the present disclosure, the array substrate further comprises a pixel definition layer on a side of the first light-emitting electrode and the connecting line away from the base substrate; the pixel definition layer has a first opening exposing the first light-emitting electrode; and the light-emitting layer and the second light-emitting electrode are at least formed in the first openings.

For example, in the texture recognition apparatus provided by at least one embodiment of the present disclosure, the array substrate further comprises a plurality of filling patterns respectively in the plurality of light-transmitting holes, a material of the plurality of filling patterns comprises a transparent insulating material.

For example, in the texture recognition apparatus provided by at least one embodiment of the present disclosure, the planarization layer is configured to comprise the light shielding layer.

For example, in the texture recognition apparatus provided by at least one embodiment of the present disclosure, a material of the pixel definition layer is same as the material of the plurality of filling patterns.

For example, in the texture recognition apparatus provided by at least one embodiment of the present disclosure, the pixel definition layer is configured to comprise the light shielding layer; or the planarization layer and the pixel definition layer are configured to collectively comprise the light shielding layer.

For example, in the texture recognition apparatus provided by at least one embodiment of the present disclosure, the array substrate further comprises a spacer on a side of the pixel definition layer away from the base substrate, a material of the spacer is same as the material of the plurality of filling patterns.

For example, in the texture recognition apparatus provided by at least one embodiment of the present disclosure, the array substrate further comprises a cover plate on a side of the second light-emitting electrode away from the base substrate, a value range of a thickness of the cover plate in a direction perpendicular to the base substrate is 100 microns to 300 microns.

For example, in the texture recognition apparatus provided by at least one embodiment of the present disclosure, the display panel comprises a first display region, a second display region, and a folding region between the first display region and the second display region, the light source array, the image sensor array and the light shielding layer are in the first display region and the second display region, and the display panel is configured to implement a folding function through the folding region, so that a touch side surface in the first display region is opposite to a touch side surface in the second display region.

At least one embodiment of the present disclosure further provides an electronic apparatus, the electronic apparatus comprises any one of the above the texture recognition apparatuses.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
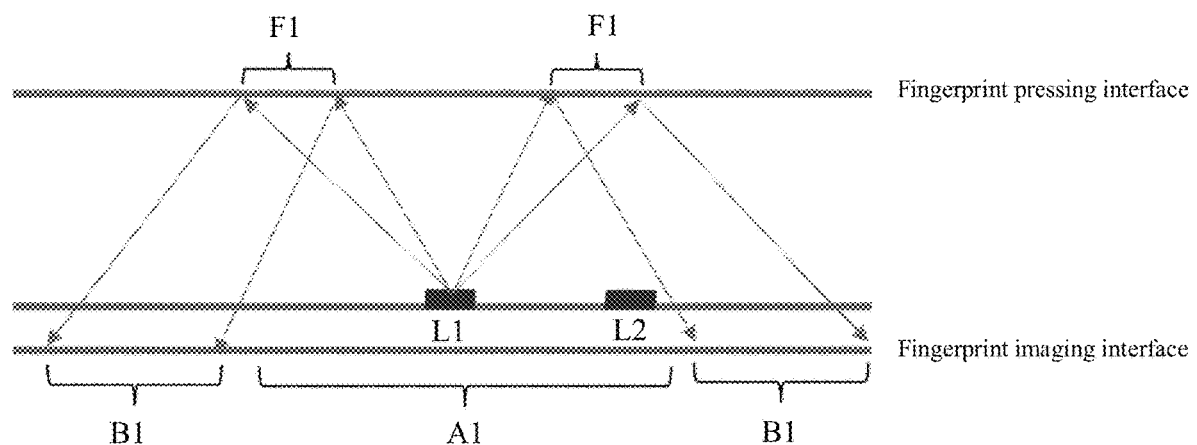
FIG. 1A is a principle diagram of fingerprint imaging.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, narrow frames are gradually becoming a mainstream in design and fabrication of display apparatuses, especially for portable display apparatuses, for example, mobile phones. One of the means to implement a narrow frame is to integrate an image sensor having a fingerprint recognition function into the display apparatus, to implement an under-screen fingerprint recognition mode, increase an area of a display region of the display apparatus, and further increase a screen-to-body ratio.

For example, a point light source, a line light source, a surface light source, a light source having a certain pattern, or the like may be used as a photosensitive light source of the image sensor, to perform fingerprint recognition. In addition, there are diverse ways to arrange the light source and the image sensor, for example, the light source may be arranged on a side of the image sensor close to fingerprint touch, or the light source may be arranged on the same plane as the image sensor, or the light source may also be arranged on a side of the image sensor away from fingerprint touch. The arrangement mode of the light source and the image sensor may be selected and set according to different needs.

Hereinafter, a fingerprint recognition principle is introduced by taking the case that the point light source is used as the photosensitive light source of the image sensor, and the light source is arranged on the side of the image sensor close to fingerprint touch as an example, but this does not form limitation on the embodiments of the present disclosure.

In a reflective optical fingerprint recognizing apparatus, during a fingerprint recognition process, as shown in FIG. 1A, when a point light source L1 emits light, light emitted thereby irradiates a fingerprint pressing interface (e.g., an outer surface of a glass screen) at different angles; due to an effect of total reflection of the fingerprint pressing interface, a portion of the light whose incident angle is greater than or equal to a critical angle θ of total reflection will undergo total reflection, resulting in that the portion of light cannot be emergent from the fingerprint pressing interface, thereby generating a total reflection region. Correspondingly, a portion of the light whose incident angle is less than the critical angle θ of total reflection is emergent from the fingerprint pressing interface. Therefore, a texture image can be collected through the light reflected by the total reflection region; for example, a clear texture image is formed at B1 of the fingerprint imaging interface where the image sensor is located, and the texture image corresponds to a portion of the fingerprint located at F1, F1 is the total reflection region, and B1 is the imaging region.

Specifically, when a fingerprint of a user's finger is pressed to the total reflection region F1, a ridge of the fingerprint touches a surface of the total reflection region F1, so a total reflection condition in a position corresponding to the ridge of the fingerprint is destroyed, and the light will be emergent in the corresponding position, so that an original reflection path is changed, and a valley of the fingerprint will not touch the surface of the total reflection region F1, a total reflection condition of a position corresponding to the valley of the fingerprint is not destroyed, and therefore the light is still totally reflected in the corresponding position, the original reflection path is not changed. In this way, due to different effects of valleys and ridges of the fingerprint on the total reflection condition of light in the total reflection region, the light incident on the fingerprint imaging interface forms bright-dark texture images in different positions.

In addition, because there is interference caused by light emitted from the fingerprint pressing interface and reflected by the fingerprint, etc., or light emitted by the light source and reflected by other functional layers to the fingerprint imaging interface before reaching the fingerprint pressing interface, A1 of the fingerprint imaging interface becomes a detection invalid region, and the region cannot form a valid texture image. In the invalid region A1, in the light emitted by the light source L1, a portion that is reflected by other functional layers to the fingerprint imaging interface before reaching the fingerprint pressing interface, and a portion that is almost vertically reflected by the fingerprint pressing interface have high brightness, which is basically located in a center position of the invalid region A1, thereby forming a highlight region; the highlight region generates a greater photoelectric signal in a corresponding portion of the image sensor array due to high brightness of the light, so that a residual image is easily formed, the highlight region may also be referred to as a residual image region.

Figure 1B:
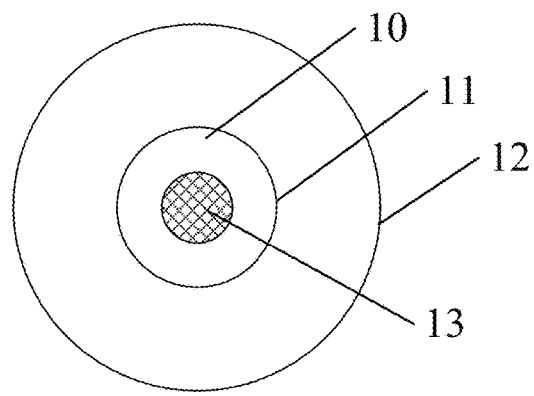
FIG. 1B is a schematic diagram of an imaging range of a point light source.

For example, FIG. 1B shows an imaging range diagram of a point light source. As shown in FIG. 1B, in a photosensitive range of the point light source, a valid imaging range is in a ring shape, that is, in FIG. 1B, a ring-shaped region between an inner circle 11 and an outer circle 12 is the valid imaging range, which corresponds to an imaging region B1 corresponding to the total reflection region F1 in FIG. 1A; a region within the inner circle 11 of the ring shape (hereinafter referred to as a ring center 10) is an invalid imaging region, corresponding to the invalid region A1 in FIG. 1A; a portion of the region 13 inside the ring center 10 (a shadow region) is a highlight region (a residual image region) that tends to cause a residual image in the image sensor array during imaging.

Figure 1C:
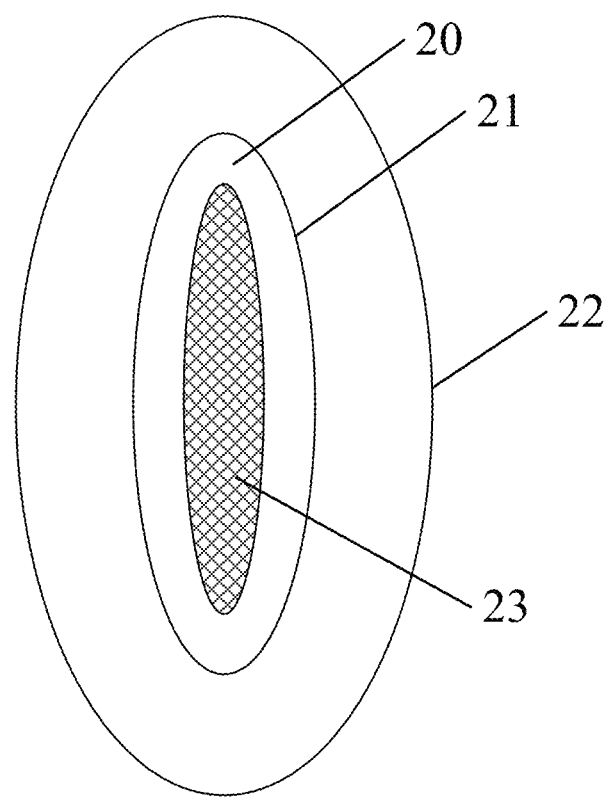
FIG. 1C is a schematic diagram of an imaging range of a line light source.

Similarly, FIG. 1C shows an imaging range diagram of a line light source. As shown in FIG. 1C, a valid imaging range of a line light source is a racetrack-like ring-shaped region or a long-elliptical ring-shaped region between the inner circle 21 and the outer circle 22; a ring center 20 is an invalid imaging region; and a portion of the region inside the ring center 10 (a shadow region) 23 is a highlight region (a residual image region) that tends to cause a residual image in the image sensor array during imaging.

Figure 1D:
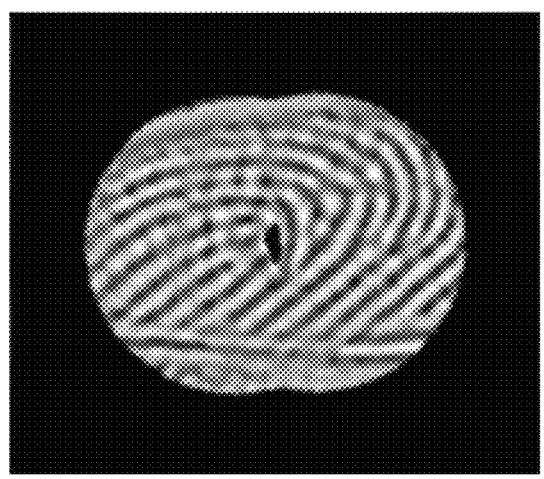
FIG. 1D is a fingerprint image collected in a weak light environment.
Figure 1E:
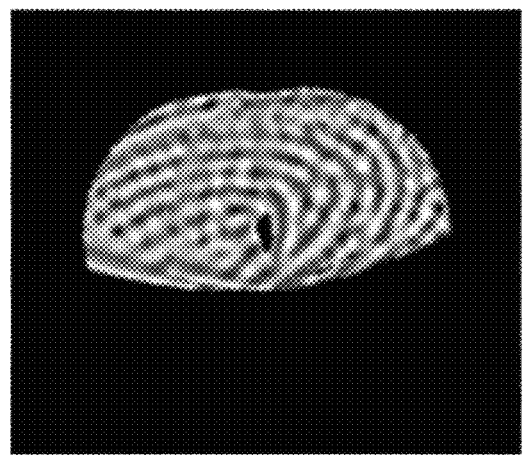
FIG. 1E is a fingerprint image collected in a strong light environment.

In addition, for fingerprint recognition, because an image area for fingerprint recognition in a point light source solution is small, it is easily interfered by external strong light, especially an edge portion of the fingerprint is interfered with a more obvious degree. For example, FIG. 1D is a fingerprint image collected in a weak light environment; FIG. 1E is a fingerprint image collected in a strong light environment, for example, FIG. 1D is a fingerprint image collected in an indoor weak light environment, and FIG. 1E is, for example, a fingerprint image collected in an outdoor strong light environment. As shown in FIG. 1D and FIG. 1E, in a small-area fingerprint recognition process, no matter in the strong light environment or the weak light environment, the fingerprint in a partial region of the fingerprint image is clear, while a fingerprint signal in another partial region is weak, and even difficult to distinguish.

Because light is passively received in the process of recognizing the fingerprint image with the point light source optical path, the light emitted by the light source array will not be actively distinguished from the ambient light; in addition, some fingerprint recognizing apparatuses are provided with polarizers; and the presence of the polarizer causes uneven irradiance of the fingerprint image. Therefore, strong ambient light or uneven irradiation may interfere with fingerprint recognition of the image sensor, resulting in blurred or even failed texture imaging. In the field of under-screen fingerprint recognition technology, it is necessary to taken into account both elimination of interference of external ambient light and implementation of large-area fingerprint recognition.

At least one embodiment of the present disclosure provides a texture recognition apparatus, the texture recognition apparatus has a touch side surface, and includes a light source array, an image sensor array, and a light shielding layer. The light source array includes a plurality of light sources; the image sensor array includes a plurality of image sensors, the plurality of image sensors are configured to be able to receive light emitted from the plurality of light sources and reflected by a texture to the plurality of image sensors for texture image collection, each of the plurality of image sensors includes a photosensitive element; the light shielding layer is provided on a light incident side of the image sensor array, the light shielding layer includes a plurality of light-transmitting holes; the plurality of light-transmitting holes are configured to collimate light emitted by the plurality of light sources and reflected by the texture to a direction perpendicular to the touch side surface; and in the direction perpendicular to the touch side surface, a photosensitive element in each of the plurality of image sensors at least partially overlaps with at least one of the plurality of light-transmitting holes.

In the texture recognition apparatus, the plurality of light-transmitting holes of the light shielding layer collimate light reflected by the texture to the direction perpendicular to the touch side surface, so that the collimated light accurately corresponds to valleys and ridges of the texture without being cross-talked by other stray light such as ambient light or being interfered by strong light, and further the plurality of image sensors only receive signal light reflected by the texture, so as to obtain a clearer and more accurate texture image, and implement accurate large-area texture recognition.

At least one embodiment of the present disclosure further provides an electronic apparatus, the electronic apparatus includes the above-described texture recognition apparatus.

The texture recognition apparatus and the electronic apparatus according to the present disclosure will be exemplarily described below through several specific embodiments.

Figure 2:
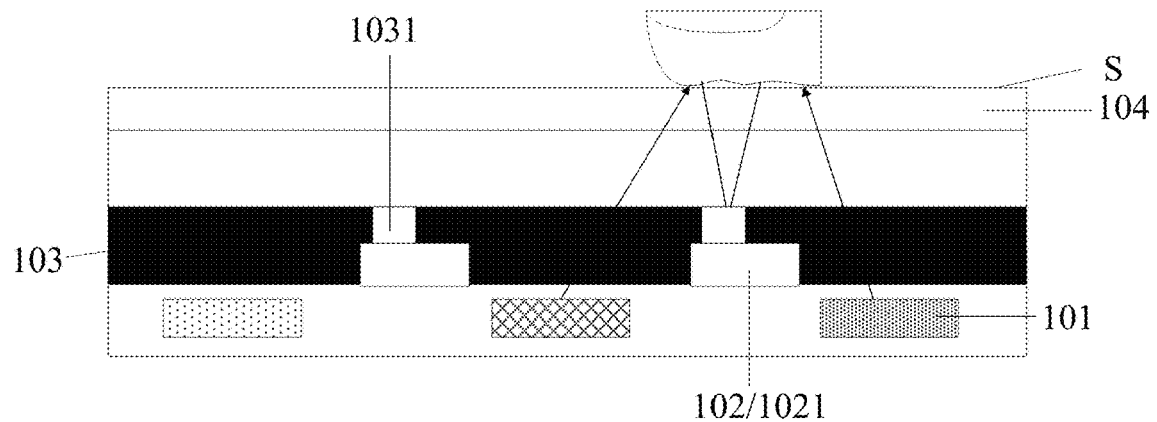
FIG. 2 is a cross-sectional schematic diagram of a texture recognition apparatus provided by at least one embodiment of the present disclosure.

At least one embodiment of the present disclosure provides a texture recognition apparatus; and FIG. 2 shows a cross-sectional schematic diagram of the texture recognition apparatus.

As shown in FIG. 2, the texture recognition apparatus has a touch side surface S, and includes a light source array, an image sensor array and a light shielding layer 103. For example, a touch side of the texture recognition apparatus has a cover plate 104, for example, a glass cover plate; and a surface of the cover plate 104 is formed as the touch side surface S. When an operating body having a texture such as a finger or a palm touches the touch side surface S, the texture recognition apparatus can collect and recognize the texture such as a fingerprint or a palmprint.

For example, the light source array includes a plurality of light sources 101; and the plurality of light sources 101 are arranged in an array in a predetermined region. The image sensor array includes a plurality of image sensors 102; and the plurality of image sensors 102 are arranged in an array in a predetermined region. The plurality of image sensors 102 are configured to be able to receive light emitted from the plurality of light sources 101 and reflected by the texture to the plurality of image sensors 102 for texture image collection.

For example, the light shielding layer 103 is on a light incident side of the image sensor array, that is, on a side of the image sensor array close to the touch side surface S, shown as an upper side of the image sensor array in the figure, to cover the image sensor array; in one embodiment, the light shielding layer 103 is provided on a surface of the image sensor array close to the touch side surface S. The light shielding layer 103 includes a plurality of light-transmitting holes 1031. The plurality of light-transmitting holes 1031 are configured to collimate light emitted by the plurality of light sources 101 and reflected by the texture to a direction perpendicular to the touch side surface S (i.e., a vertical direction in the figure). In the direction perpendicular to the touch side surface S, a photosensitive element 1021 in each of the plurality of image sensors 102 at least partially overlaps with at least one of the plurality of light-transmitting holes 1031, that is, the photosensitive element 1021 of each image sensor 102 is correspondingly provided with at least one light-transmitting hole 1031, so that light passing through the at least one light-transmitting hole 1031 can irradiate the photosensitive element 1021 of the image sensor 102 for forming a texture image.

Thus, light reflected by the texture on the touch side surface S can respectively pass through the plurality of light-transmitting holes 1031, and then irradiates onto the photosensitive elements 1021 of the plurality of image sensors 102; and the light passing through the plurality of light-transmitting holes 1031 more tends to be vertically incident on the photosensitive elements 1021 of the plurality of image sensors 102, to improve a light utilization rate of the photosensitive elements 1021 of the plurality of image sensors 102; in addition, light collimated by the plurality of light-transmitting holes 1031 of the light shielding layer 103 precisely corresponds to valleys and ridges of the texture, without being cross-talked by other stray light such as ambient light or being interfered by strong light, so that the photosensitive element 1021 of each image sensor 102 only receives light filtered by the light-transmitting hole 1031, and therefore the image sensor 102 can obtain clearer and more accurate texture images for accurate texture recognition.

For example, a material of the light shielding layer 103 may include an organic resin material doped with black pigment, so as to implement a light shielding effect, that is, light cannot pass through non-light-transmitting positions of the light shielding layer 103.

Figure 3:
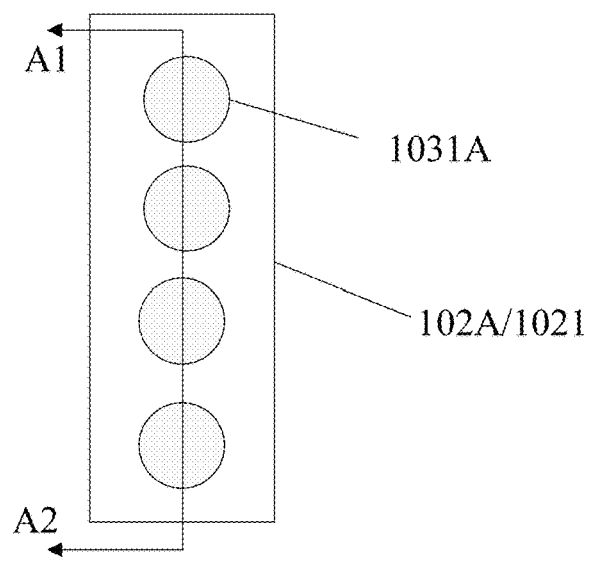
FIG. 3 is a schematic plan view of a light-transmitting hole and a photosensitive element in a texture recognition apparatus provided by at least one embodiment of the present disclosure.

For example, in some embodiments, the photosensitive element 1021 of the image sensor 102 may be correspondingly provided with multiple light-transmitting holes 1031. For example, FIG. 3 is a schematic plan view of a light-transmitting hole and a photosensitive element in a texture recognition apparatus provided by at least one embodiment of the present disclosure. As shown in FIG. 3, the plurality of light-transmitting holes 1031 include a plurality of first light-transmitting holes 1031A arranged in an array. The plurality of image sensors 102 include a first image sensor 102A. In the direction perpendicular to the touch side surface S, a photosensitive element 1021 of the first image sensor 102A at least partially overlap with the plurality of first light-transmitting holes 1031A, that is, the photosensitive element 1021 of the first image sensor 102A corresponds to the plurality of first light-transmitting holes 1031A, to improve efficiency of texture recognition.

For example, in the direction perpendicular to the touch side surface S, orthogonal projections of the plurality of first light-transmitting holes 1031A are located in an orthogonal projection of the first image sensor 102A. For example, in the example shown in FIG. 3, the number of the plurality of first light-transmitting holes 1031A corresponding to the photosensitive element 1021 of the first image sensor 102A is 4. The photosensitive element 1021 of the first image sensor 102A is configured to have a sufficient photosensitive area; and the plurality of first light-transmitting holes 1031A can sufficiently transmit light reflected by the texture to meet requirements of texture recognition.

For example, the plurality of image sensors 102 included in the image sensor array are all arranged in the same manner as the first image sensor 102A, that is, the photosensitive element 1021 of each of the plurality of image sensors is correspondingly provided with multiple light-transmitting holes 1031.

It should be noted that, the embodiments of the present disclosure are not limited to the number of first image sensors 102A corresponding to the first light-transmitting holes 1031A. FIG. 3 shows an embodiment, which does not constitute a limitation on the embodiments of the present disclosure. In other embodiments, the number of first light-transmitting holes 1031A corresponding to the first image sensor 102A may also be 2, 3, 5 or more.

For example, in some examples, planar shapes of the photosensitive elements 1021 of the plurality of image sensors 102 are rectangles. In other examples, the planar shapes of the photosensitive elements 1021 of the plurality of image sensors 102 may also be other shapes, for example, ellipses, pentagons, hexagons, or other irregular shapes, etc., the embodiments of the present disclosure are not limited in this aspect.

For example, the embodiments of the present disclosure take the shapes of the plurality of light-transmitting holes 1031 being circles as an example. In other examples, the plurality of light-transmitting holes 1031 may also have other shapes, for example, squares or rectangles.

For example, as shown in FIG. 2, when an operating body having a texture such as a finger touches the touch side surface S of the texture recognition apparatus, light emitted by the plurality of light sources 101 can be reflected by the operating body and pass through the plurality of light-transmitting holes 1031 of the light shielding layer 103 to reach the image sensor 102, and the image sensor 102 can collect a texture image of the operating body by sensing the light.

As described above, the operating body having a texture may be a hand, and the texture recognized by the image sensor 102 is a skin texture, for example, a fingerprint, a palmprint, etc.; in addition, the operating body having a texture may also be a non-biological object having a certain texture, for example, an object having a certain texture made of a material such as resin, the embodiments of the present disclosure are not limited in this aspect.

Figure 4:
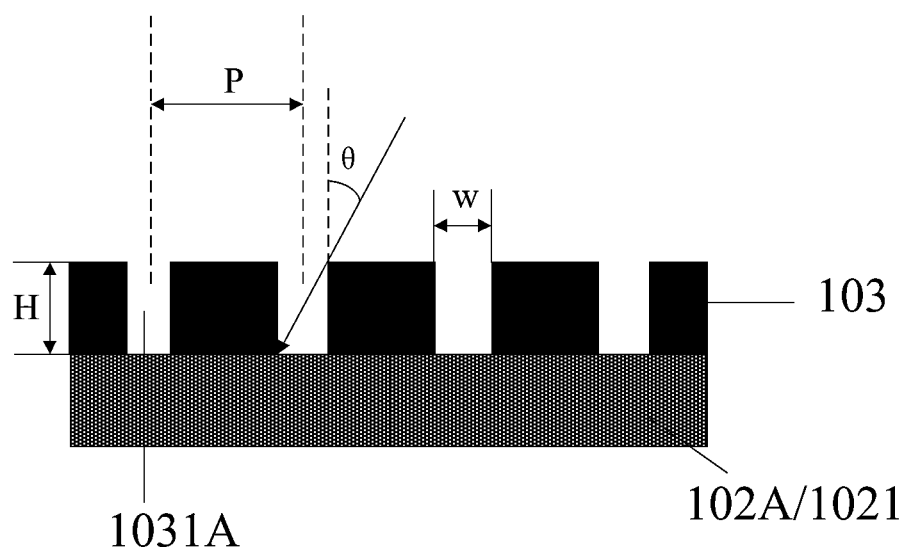
FIG. 4 is a schematic diagram of a texture recognition optical path in a texture recognition apparatus provided by at least one embodiment of the present disclosure.

For example, FIG. 4 is a schematic diagram of a texture recognition optical path in a texture recognition apparatus provided by at least one embodiment of the present disclosure, for example, FIG. 4 is a sectional view taken along a line A1-A2 in FIG. 3. As shown in FIG. 4, for example, a value range of a diameter w of the first light-transmitting hole 1031A (e.g., along a direction parallel to the touch side surface S) is about 1 microns to 10 microns, for another example, a value of the diameter w of the first light-transmitting hole 1031A is about 2 microns, 3 microns, or 5 microns, etc. For example, a value range of a height H of the first light-transmitting hole 1031A in the direction perpendicular to the touch side surface S is about 4 microns to 50 microns; for another example, the value range of the height H of the first light-transmitting hole 1031A in the direction perpendicular to the touch side surface S is about 4 microns to 10 microns; and for a further example, a value of the height H is about 5 microns or 6 microns. The greater the diameter w of the first light-transmitting hole 1031A, the more the light passing through the first light-transmitting hole 1031A after being reflected by the texture; and the greater the height H of the first light-transmitting hole 1031A, the less the light passing through the first light-transmitting hole 1031A after being reflected by the texture; so selecting suitable ranges of the diameter w and the height H of the first light-transmitting hole 1031A is favorable for the first light-transmitting hole 1031A to better screen light reflected by the texture, so that light collimated by the first light-transmitting hole 1031A can accurately correspond to the valleys and the ridges of the texture, without being cross-talked by other stray light such as ambient light.

It should be noted that, in the embodiments of the present disclosure, the word "about" indicates that a numerical range or a numerical value may fluctuate within a range of, for example, ±5%, and for example, ±10%.

For example, as shown in FIG. 4, a value range of an aperture ratio H/w of the first light-transmitting hole 1031A is about 1 to 10, for example, 3, 5, or 8. An included angle θ in the figure represents an included angle between the light reflected by the texture and the direction perpendicular to the touch side surface S. When the included angle between the light reflected by the texture and the direction perpendicular to the touch side surface S is smaller than the included angle θ, the reflected light can pass through the first light-transmitting hole 1031A, that is, light whose included angle with the direction perpendicular to the touch side surface S is smaller than θ can pass through the first light-transmitting hole 1031A, for example, θ can be calculated from the aperture ratio H/w. The light passing through the first light-transmitting hole 1031A is received by the photosensitive element 1021 of the first image sensor 102A for texture image collection. When the included angle between the light reflected by the texture and the direction perpendicular to the touch side surface S is greater than the included angle θ, the reflected light cannot be incident into the first light-transmitting hole 1031A.

For example, the aperture ratio H/w is directly related to the included angle θ; and a value of tan θ is the reciprocal of the aperture ratio. That is, the greater the aperture ratio, the greater the depth of the first light-transmitting hole 1031A, and the smaller the included angle θ, the less the light that can be incident into the first light-transmitting hole 1031A. When the value range of the aperture ratio H/w of the first light-transmitting hole 1031A is about 1 to 10, the first light-transmitting hole 1031A can better filter the light reflected by the texture, so that light collimated by the first light-transmitting hole 1031A can accurately correspond to the valleys and the ridges of the texture, without being cross-talked by other stray light such as ambient light.

For example, as shown in FIG. 4, a value range of a separation distance P between two adjacent first light-transmitting holes of the plurality of first light-transmitting holes 1031A is about 2 microns to 10 microns, for example, a value of the separation distance P is about 3 microns, 4 microns, or 6 microns etc. The separation distance P in the figure represents a distance between centerlines of two adjacent first light-transmitting holes 1031A in a direction parallel to an arrangement direction of the plurality of first light-transmitting holes 1031A (e.g., an arrangement direction of the plurality of first light-transmitting holes 1031A in FIG. 3). The larger the value of the separation distance P of the first light-transmitting holes 1031A, the smaller the number of first light-transmitting holes 1031A corresponding to the photosensitive element 1021 of the first image sensor 102A, that is, the less the light that can be received by the photosensitive element 1021 of the first image sensor 102A. When the value range of the separation distance P between two adjacent first light-transmitting holes of the plurality of first light-transmitting holes 1031A is about 2 microns to 10 microns, the photosensitive element 1021 of each image sensor 102 can uniformly and sufficiently receive light filtered by the light-transmitting holes 1031, to obtain a clearer and more accurate texture image to implement accurate large-area texture recognition.

Figure 5:
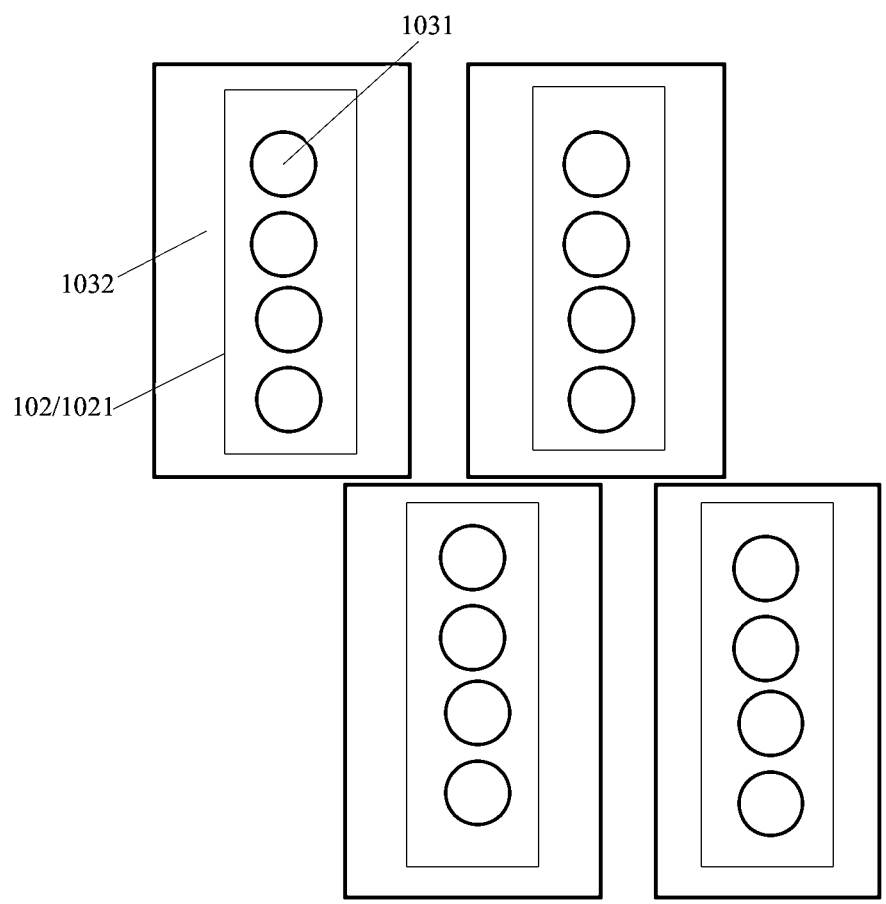
FIG. 5 is a schematic plan view of a light-transmitting hole and a photosensitive element in another texture recognition apparatus provided by at least one embodiment of the present disclosure.

For example, FIG. 5 is a schematic plan view of a light-transmitting hole and a photosensitive element in another texture recognition apparatus provided by at least one embodiment of the present disclosure. As shown in FIG. 5, the light shielding layer includes a plurality of light shielding patterns 1032 arranged in an array. For example, four image sensors 102 are shown in FIG. 5 as an example. In the direction perpendicular to the touch side surface S, the plurality of light shielding patterns 1032 are in one-to-one correspondence and at least partially overlap with the plurality of image sensors 102, that is, the light shielding pattern 1032 covers at least a portion of the image sensor 102. As shown in the figure, the light shielding patterns 1032 are in one-to-one correspondence with the image sensors 102; and an orthogonal projection of the image sensor 102 on a plane where the light shielding pattern 1032 is located is located inside the light shielding pattern 1032. The plurality of light-transmitting holes 1031 are distributed in the plurality of light shielding patterns 1032. For example, the photosensitive element 1021 of each image sensor 102 correspondingly receives light filtered by one or more light-transmitting holes 1031, so as to obtain a clearer and more accurate texture image, and implement accurate large-area texture recognition.

Figure 6:
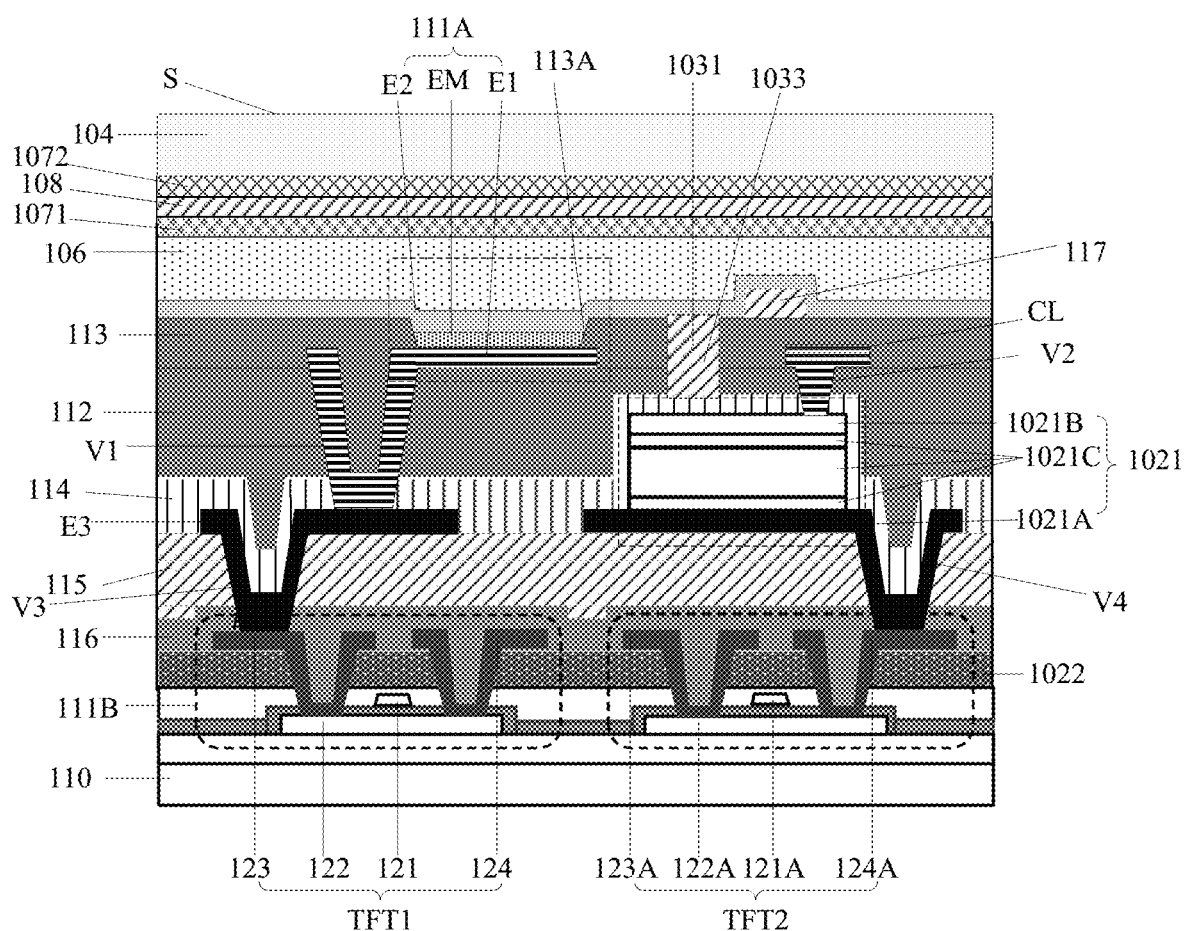
FIG. 6 is a cross-sectional schematic diagram of a texture recognition apparatus provided by at least one embodiment of the present disclosure.
Figure 8A:
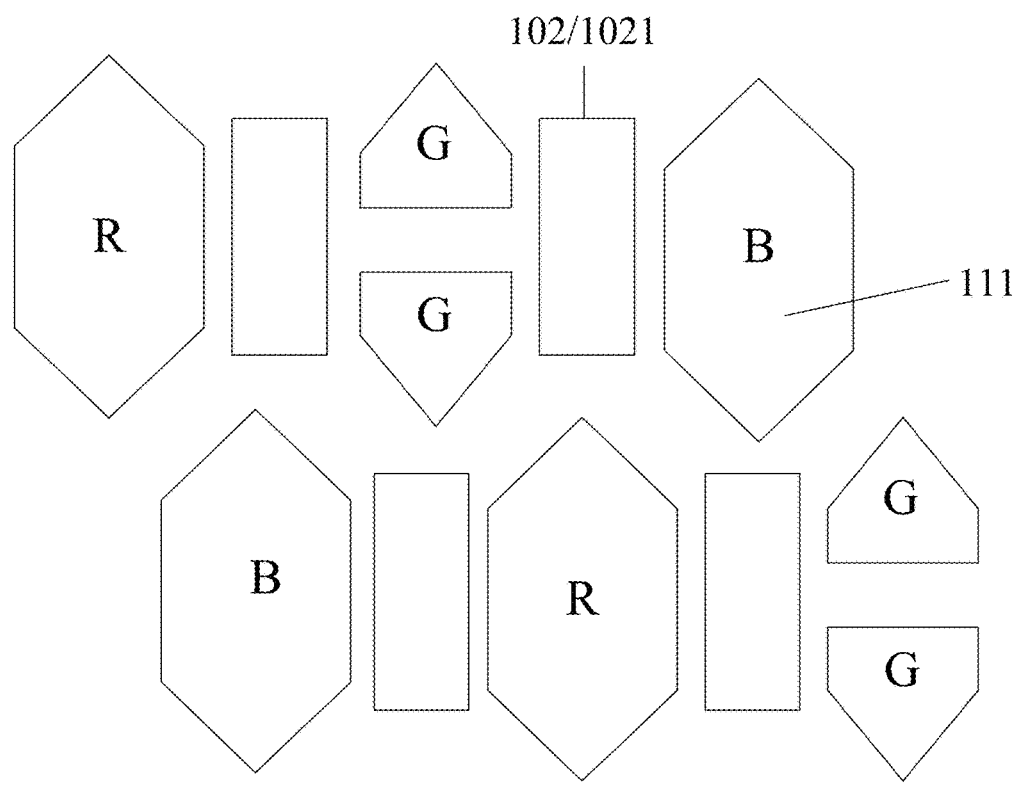
FIG. 8A is a schematic plan view of a sub-pixel array and an image sensor array in a display apparatus provided by at least one embodiment of the present disclosure.

For example, in some embodiments, the texture recognition apparatus is, for example, a display apparatus having an under-screen texture recognition function, and accordingly includes a display panel. FIG. 6 is a cross-sectional schematic diagram of a texture recognition apparatus provided by at least one embodiment of the present disclosure. FIG. 8A is a schematic plan view of a sub-pixel array and an image sensor array in a display apparatus provided by at least one embodiment of the present disclosure.

For example, as shown in FIG. 6 and FIG. 8A, the display panel 10 (shown in FIG. 14) includes an array substrate; the array substrate includes a base substrate 110 and a sub-pixel array provided on the base substrate 110; and the sub-pixel array includes a plurality of sub-pixels 111. For example, the light source array includes the sub-pixel array, and the plurality of light sources 101 include the plurality of sub-pixels 111, and therefore the sub-pixel array is further used as the light source array, and the plurality of sub-pixels 111 are further used as the plurality of light sources 101. That is, at least some of the sub-pixels 111 of the display panel 10 are further used as the light sources 101, so that the compactness of the display apparatus can be improved, and the arrangement difficulty of respective functional structures can be reduced.

For example, in some embodiments, sub-pixels 111 in the entire display region of the display panel 10 can be controlled to be further used as the light sources 101, and the image sensor array may also be correspondingly arranged below the entire display region, thereby implementing full-screen texture recognition.

For example, in other embodiments, a display apparatus having an under-screen texture recognition function includes a display panel 10 and separately provided light-emitting elements serving as the photosensitive light source for implementing texture recognition; these light-emitting elements are, for example, arranged between adjacent sub-pixels in the sub-pixel array, or overlapped with the sub-pixels, the embodiments of the present disclosure re not limited in this aspect.

Figure 8B:
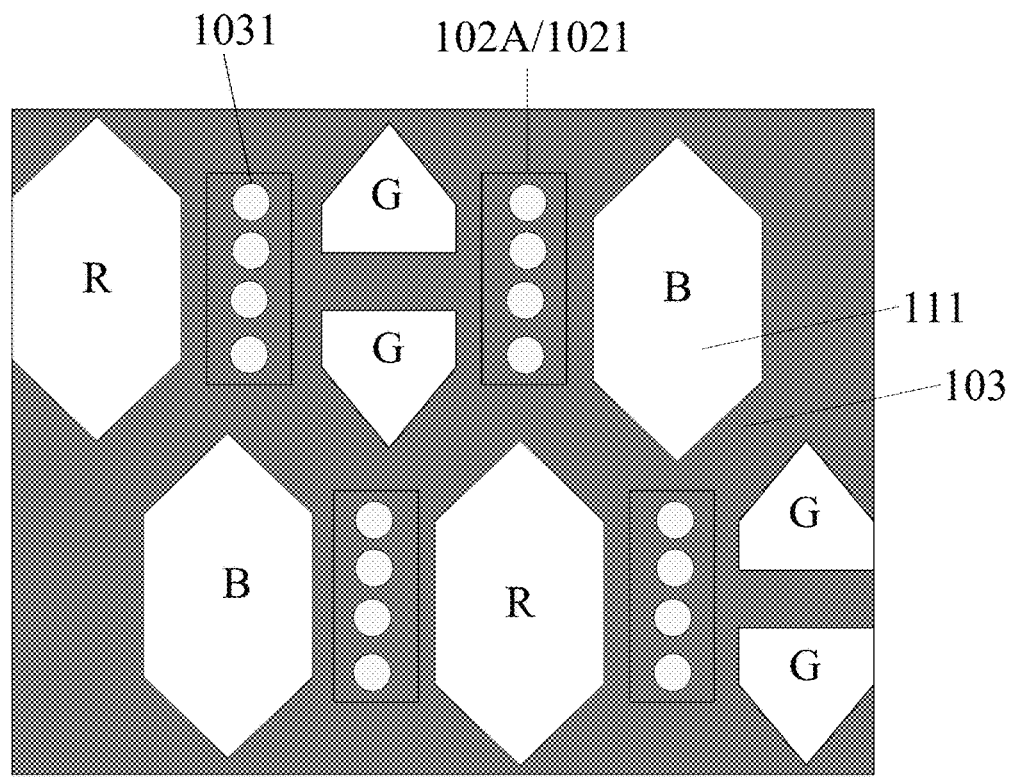
FIG. 8B is a schematic plan view of a sub-pixel array, an image sensor array, and a light shielding layer in a display apparatus provided by at least one embodiment of the present disclosure.
Figure 8C:
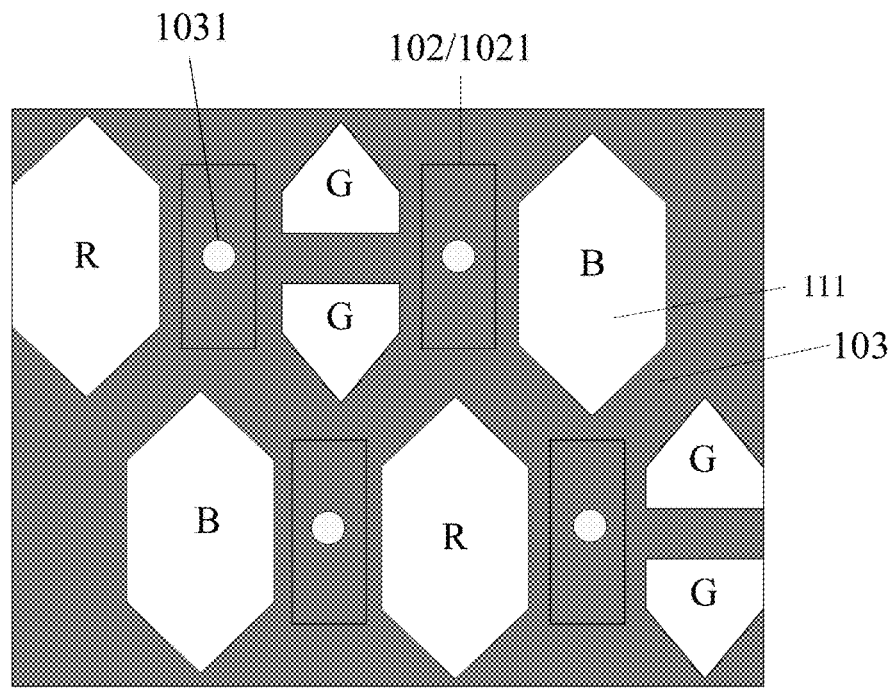
FIG. 8C is a schematic plan view of a sub-pixel array, an image sensor array, and a light shielding layer in another display apparatus provided by at least one embodiment of the present disclosure.

For example, FIG. 8B is a schematic plan view of a sub-pixel array, an image sensor array, and a light shielding layer in a display apparatus provided by at least one embodiment of the present disclosure; and FIG. 8C is a schematic plan view of a sub-pixel array, an image sensor array, and a light shielding layer in another display apparatus provided by at least one embodiment of the present disclosure. As shown in FIG. 8A, FIG. 8B and FIG. 8C, the plurality of sub-pixels 111 include a plurality of sub-pixels of different colors. For example, the plurality of sub-pixels 111 include a red sub-pixel R, a blue sub-pixel B, and a green sub-pixel G. For example, as shown in the figure, one red sub-pixel R, one blue sub-pixel B and two green sub-pixels G constitute a pixel unit; and the two green sub-pixels G are separately arranged between the red sub-pixel R and the blue sub-pixel B that are adjacent to each other. For example, as shown in FIG. 8A, the photosensitive element 1021 of each image sensor 102 is arranged between adjacent sub-pixels. As shown in FIG. 8B and FIG. 8C, after the light shielding layer 103 is provided, in the direction perpendicular to the touch side surface S, the light shielding layer 103 respectively shields the photosensitive elements 1021 of the plurality of image sensors 102, and the plurality of light-transmitting holes 1031 of the light shielding layer 103 are arranged between adjacent sub-pixels 111 to correspond to the photosensitive elements 1021 of the plurality of image sensors 102. Thus, the photosensitive element 1021 of each image sensor 102 correspondingly receives light filtered by the light-transmitting hole 1031, thereby implementing accurate full-screen texture recognition.

For example, as shown in FIG. 8B, multiple light-transmitting holes 1031 are provided between adjacent sub-pixels 111. For example, the multiple light-transmitting holes 1031 are arranged in a column; or in other embodiments, the multiple light-transmitting holes 1031 are arranged in an array of a plurality of rows and a plurality of columns. The photosensitive element 1021 of each image sensor 102 corresponds to multiple light-transmitting holes 1031 (e.g., 4 light-transmitting holes 1031 in the diagram). The photosensitive element 1021 of each image sensor 102 has a sufficient photosensitive area, and the multiple light-transmitting holes 1031A can sufficiently transmit light reflected by the texture to meet requirements of texture recognition.

For example, as shown in FIG. 8C, one light-transmitting hole 1031 is provided between adjacent sub-pixels 111; and the photosensitive element 1021 of each image sensor 102 corresponds to the one light-transmitting hole 1031. The photosensitive element 1021 of each image sensor 102 receives light filtered by the light-transmitting hole 1031 in one-to-one correspondence.

For example, as shown in FIG. 6, each of the plurality of sub-pixels 111 includes a pixel driving circuit provided on the base substrate 110; the pixel driving circuit includes a thin film transistor 111B; each of the plurality of image sensors 102 further includes a switch transistor 1022 provided on the base substrate 110; and the thin film transistor 111B and the switch transistor 1022 are arranged in the same layer. For example, the switch transistor 1022 may be a thin film transistor or a polysilicon transistor, etc. For example, the thin film transistor 111B includes a first transistor TFT1; and the switch transistor 1022 includes a second transistor TFT2.

For example, the first transistor TFT1 and the second transistor TFT2 may be P-type transistors or N-type transistors, and the embodiments of the present disclosure are not limited thereto.

As shown in FIG. 6, the first transistor TFT1 includes an active layer 122, a gate electrode 121, and source-drain electrodes 123 and 124. The second transistor TFT2 includes an active layer 122A, a gate electrode 121A, and source-drain electrodes 123A and 124A; the active layer 122A and the active layer 122 are provided in the same layer; the gate electrode 121A and the gate electrode 121 are provided in the same layer; and the source-drain electrodes 123A and 124A and the source-drain electrodes 123 and 124 are provided in the same layer; so as to simplify a preparation process of the display panel. Or, at least some functional layers of the first transistor TFT1 and the second transistor TFT2 are provided in the same layer, so as to simplify a preparation process of the display substrate.

It should be noted that, in the embodiments of the present disclosure, "in a/the same layer" refers to that two functional layers or structural layers are formed in the same layer and with the same material in a hierarchical structure of the display substrate, that is, in the preparation process, the two functional layers or structural layers are formed by the same material layer, and desired patterns and structures can be formed by the same patterning process.

For example, the active layer 122A and the active layer 122 may be amorphous silicon layers, polysilicon layers, or metal oxide semiconductor layers. For example, the polysilicon may be high-temperature polysilicon or low-temperature polysilicon; and the oxide semiconductor may be indium gallium zinc oxide (IGZO), indium zinc oxide (IZO), zinc oxide (ZnO), gallium zinc oxide (GZO), or the like. The gate electrode 121A and the gate electrode 121 may be made of metal materials such as copper (Cu), aluminum (Al), titanium (Ti) or alloy materials, for example, may be formed into a single-layer metal layer structure or a multi-layer metal layer structure, for example, a multi-layer metal layer structure of titanium/aluminum/titanium. The source-drain electrodes 123A and 124A and the source-drain electrodes 123 and 124 may be made of metal materials such as copper (Cu), aluminum (Al), titanium (Ti) or alloy materials, for example, may be formed into a single-layer metal layer structure or a multi-layer metal layer structure, for example, a multi-layer metal layer structure of titanium/aluminum/titanium.

For example, as shown in FIG. 6, the photosensitive element 1021 is provided on a side of the switch transistor 1022 away from the base substrate 110, and includes a first electrode 1021A, a second electrode 1021B and a semiconductor layer 1021C between the first electrode 1021A and the second electrode 1021B; and the first electrode 1021A is electrically connected with the switch transistor 1022, so that the switch transistor 1022 can control a voltage applied to the first electrode 1021A, and therefore control an operation state of the photosensitive element 1021.

For example, the photosensitive element 1021 may be a PN photodiode or a PIN photodiode, etc., in this case, the semiconductor layer 1021C includes a P-type semiconductor layer and an N-type semiconductor layer (e.g., an N-type Si layer) that are stacked, or includes a P-type semiconductor layer (e.g., a P-type Si layer), an intrinsic semiconductor layer (e.g., an intrinsic Si layer), and an N-type semiconductor layer (e.g., an N-type Si layer) that are stacked. For example, the second electrode 1021B is a transparent electrode, which may be made of a material such as a transparent metal oxide, such as indium tin oxide (ITO), indium zinc oxide (IZO), and gallium zinc oxide (GZO). The first electrode 1021A is a metal electrode, and is made of a metal material such as copper (Cu), aluminum (Al), and titanium (Ti) or an alloy material.

For example, the array substrate further includes a planarization layer 112 provided on a side of the photosensitive element 1021 away from the base substrate 110, the planarization layer 112 has a first via V1 and a second via V2 therein. Each of the plurality of sub-pixels 111 further includes a light-emitting device 111A, the light-emitting device 111A is provided on a side of the planarization layer 112 away from the base substrate 110. The light-emitting device 111A includes a first light-emitting electrode E1, a second light-emitting electrode E2, and a light-emitting layer EM between the first light-emitting electrode E1 and the second light-emitting electrode E2. The first light-emitting electrode E1 is electrically connected with the thin film transistor 111B at least through the first via V1. The array substrate further includes a connecting line CL provided in the same layer as the first light-emitting electrode E1; and the connecting line CL is electrically connected with the second electrode 1021B of the photosensitive element 1021 through the second via V2.

For example, the first light-emitting electrode E1 may be made of transparent metal oxide such as indium tin oxide (ITO), indium zinc oxide (IZO), gallium zinc oxide (GZO), etc.; and the second light-emitting electrode E2 may be made of a metal material such as lithium (Li), aluminum (Al)), magnesium (Mg), or silver (Ag).

For example, with respect to an organic light-emitting display device OLED, the light-emitting layer EM may include a small molecular organic material or a polymer molecular organic material, may be a fluorescent light-emitting material or a phosphorescent light-emitting material, may emit red light, green light, blue light, or may emit white light; in addition, the light-emitting layer may further include functional layers such as an electron injection layer, an electron transport layer, a hole injection layer, a hole transport layer, or the like as required.

With respect to a quantum dot light-emitting display device QLED, the light-emitting layer EM may include a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots, etc.; and particle sizes of the quantum dots range from 2 nm to 20 nm.

For example, the array substrate further includes an adapt electrode E3; the adapt electrode E3 is provided in the same layer as the first electrode 1021A of the photosensitive element 1021; the first light-emitting electrode E1 is electrically connected with the adapt electrode E3 through the first via V1; and the adapt electrode E3 is electrically connected with the thin film transistor 111B, to implement electrical connection between the first light-emitting electrode E1 and the thin film transistor 111B.

For example, the array substrate further includes a pixel definition layer 113 provided on a side of the first light-emitting electrode E1 and the connecting line CL away from the base substrate 110; the pixel definition layer 113 has a first opening 113A exposing the first light-emitting electrode E1; the light-emitting layer EM and the second light-emitting electrode E2 are respectively formed at least partially in the first openings 113A.

For example, as shown in FIG. 6, the array substrate further includes a spacer 117 located on a side of the pixel definition layer 113 away from the base substrate 110, that is, the spacer 117 is located between the pixel definition layer 113 and the second light-emitting electrode E2. For example, a material of spacer 117 may include a transparent insulating material.

For example, in some embodiments, the planarization layer and the pixel definition layer are configured to include the light shielding layer. As shown in FIG. 6, the planarization layer 112 and the pixel definition layer 113 may be made of an organic resin material doped with black pigment to form the light shielding layer 103. The light-transmitting hole 1031 is located in the planarization layer 112 and the pixel definition layer 113; and an orthogonal projection of the light-transmitting hole 1031 on the base substrate 110 is located in an orthogonal projection of the photosensitive element 1021 on the base substrate 110. The light-transmitting hole 1031 collimates light reflected by the texture; and the photosensitive element 1021 can receive light incident into the light-transmitting hole 1031 for texture image collection.

For example, in the preparation process, the light-transmitting hole 1031 may be formed by means of plasma etching, chemical etching, or the like.

For example, the array substrate further includes a plurality of filling patterns respectively in the plurality of light-transmitting holes; and a material of the plurality of filling patterns includes a transparent insulating material. As shown in FIG. 6, the filling pattern 1033 is located in the light-transmitting hole 1031; and when the planarization layer 112 and the pixel definition layer 113 include the light shielding layer 103, the material of the filling pattern 1033 is the same as the material of the spacer 117. For example, in the preparation process, the transparent insulating material is filled in the light-transmitting hole 1031 by chemical deposition or sputtering. For example, the filling pattern 1033 and the spacer 117 may be formed by the same patterning process.

For example, the transparent insulating material is a transparent organic material such as polyimide or resin.

For example, as shown in FIG. 6, a surface of the photosensitive element 1021 is covered with a first passivation layer 114 to protect the photosensitive element 1021 from being corroded by water vapor. The first passivation layer 114 is made of a transparent insulating material, so it will not affect transmitting of signal light.

For example, as shown in FIG. 6, the array substrate further includes a second passivation layer 116 located on a side of the thin film transistor 111B and the switch transistor 1022 away from the base substrate 110. The second passivation layer 116 has a plurality of vias to expose the thin film transistor 111B and the switch transistor 1022. For example, a material of the second passivation layer 116 may include an organic insulating material or an inorganic insulating material, for example, a silicon nitride material, which can well protect the thin film transistor 111B and the switch transistor 1022 from being corroded by water vapor due to a high dielectric constant and a good hydrophobic function.

For example, as shown in FIG. 6, the array substrate further includes a third passivation layer 115 (e.g., a first planarization layer) located on a side of the second passivation layer 116 away from the base substrate 110 to provide a planarized surface; and the second passivation layer 116 has a plurality of vias therein. For example, a third via V3 and a fourth via V4 are formed in the second passivation layer 116 and the third passivation layer 115. The adapt electrode E3 is electrically connected with the thin film transistor 111B through the third via V3. The first electrode 1021A is electrically connected with the switch transistor 1022 through the fourth via V4. For example, a material of the second passivation layer 116 may include an organic insulating material or an inorganic insulating material.

For example, as shown in FIG. 6, the array substrate further includes an encapsulation layer 106, a first adhesive layer 1071, an auxiliary electrode layer 108 and a second adhesive layer 1072. The encapsulation layer 106 is located on a side of the second light-emitting electrode E2 away from the base substrate 110. The encapsulation layer 106 seals the light-emitting device 111A, so that deterioration of the light-emitting device 111A caused by moisture and/or oxygen in the environment can be reduced or prevented. The auxiliary electrode layer 108 may be used for other auxiliary functions, for example, a touch function, etc.; and the auxiliary electrode layer 108 is located on a side of the encapsulation layer 106 away from the base substrate 110. The first adhesive layer 1071 and the second adhesive layer 1072 are respectively located on a side of the auxiliary electrode layer 108 away from the base substrate 110 and a side of the auxiliary electrode layer 108 close to the base substrate 110 (i.e., on both upper and lower sides of the auxiliary electrode layer 108); and the first adhesive layer 1071 and the second adhesive layer 1072 include optically clear adhesives to respectively bond the auxiliary electrode layer 108 to the encapsulation layer 106 and the cover plate 104.

For example, the encapsulation layer 106 may have a single-layer structure or a composite-layer structure; and the composite-layer structure includes a structure in which an inorganic layer and an organic layer are stacked. The encapsulation layer 106 includes at least one encapsulation sub-layer. For example, the encapsulation layer 106 may include a first inorganic encapsulation layer, a first organic encapsulation layer, and a second inorganic encapsulation layer arranged in sequence.

For example, a material of the encapsulation layer 106 may include an insulating material such as silicon nitride, silicon oxide, silicon oxynitride, polymer resin, or the like. Inorganic materials such as silicon nitride, silicon oxide, and silicon oxynitride have high compactness and can prevent intrusion of water and oxygen; a material of the organic encapsulation layer may be a polymer material containing a desiccant or a polymer material that can block water vapor, etc., for example, polymer resin, etc. to planarize a surface of the display substrate, which can relieve stress of the first inorganic encapsulation layer and the second inorganic encapsulation layer, and the material may further include a water-absorbing material such as a desiccant to absorb substances such as water and oxygen intruding inside.

For example, the auxiliary electrode layer 108 may include a plurality of auxiliary electrodes. The auxiliary electrodes for implementing the touch function may be configured to implement a capacitive touch structure; and the capacitive touch structure is a self-capacitive type or a mutual-capacitive type. The self-capacitive type touch structure includes a plurality of self-capacitive electrodes arranged in an array (in the same layer); and each self-capacitive electrode is electrically connected with a touch processing circuit (a touch chip) through a touch lead line. Position detection is implemented by detecting a change in capacitance of the self-capacitive electrode due to, for example, approach of a finger upon touch. The mutual-capacitive type touch structure includes a plurality of first touch signal lines extending along a first direction and a plurality of second touch signal lines extending along a second direction; the first touch signal lines and the second touch signal lines are all electrically connected with the touch processing circuit (the touch chip) through touch lead lines. The first direction and the second direction intersect with each other, thereby forming a touch capacitance at an intersection of the first touch signal line and the second touch signal line; and position detection is implemented by detecting a change in the touch capacitance due to, for example, approach of a finger upon touch. The embodiments of the present disclosure are described by taking the mutual-capacitive type touch structure as an example.

For example, the mutual-capacitive type touch structure includes a first touch signal line and a second touch signal line intersecting with each other, so as to implement the touch function of the display substrate. In the touch structure, the first touch signal line and the second touch signal line may be arranged in the same layer. For example, the first touch signal line includes a plurality of segments, and the second touch signal line is continuous; in a position where the first touch signal line and the second touch signal line intersect with each other, a bridge electrode (not shown) located in a different layer from the first touch signal line and the second touch signal line is provided to electrically connect two adjacent segments of the first touch signal line with each other. By arranging the first touch signal line and the second touch signal line, touch sensitivity of the display substrate can be improved.

For example, a material of the auxiliary electrode layer 108 may include indium tin oxide (ITO), and therefore a transparent electrode can be obtained, or the material of the auxiliary electrode layer 108 may include a metal mesh, and therefore a transparent electrode can also be obtained.

Figure 7:
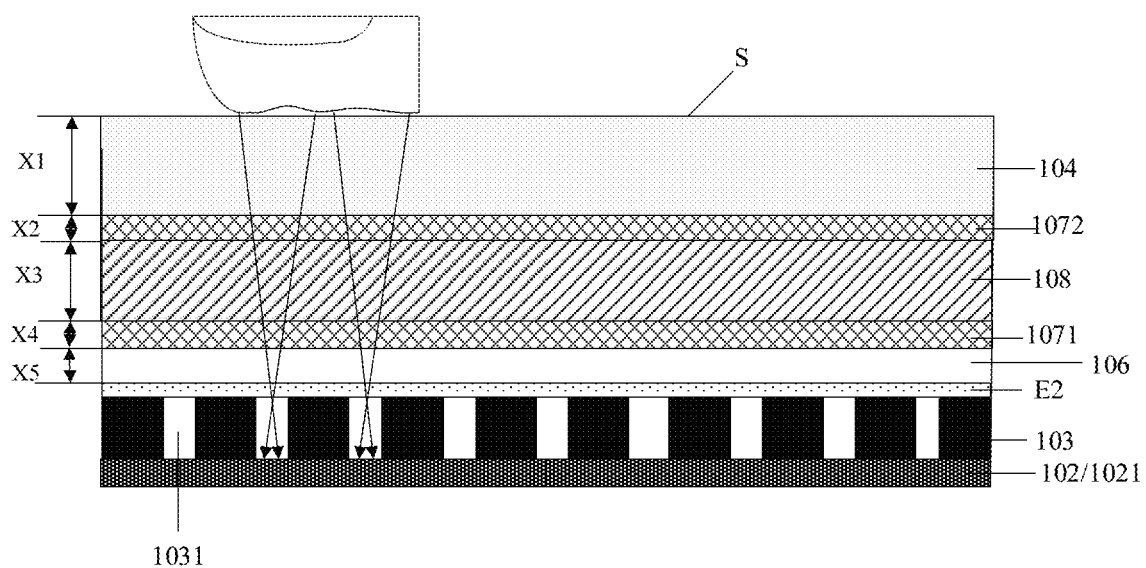
FIG. 7 is a schematic diagram of a texture recognition optical path of the texture recognition apparatus in FIG. 6.

For example, FIG. 7 is a schematic diagram of a texture recognition optical path of the texture recognition apparatus in FIG. 6. As shown in FIG. 7, light emitted from a plurality of light sources 101 is reflected by the texture to a plurality of light-transmitting holes 1031. The plurality of light-transmitting holes 1031 are configured to collimate light reflected by the texture to the direction perpendicular to the touch side surface S. The light collimated by the plurality of light-transmitting holes 1031 is received by the photosensitive element 1021 of the image sensor 102 for texture image collection. The light reflected by the texture needs to pass through the cover plate 104, the second adhesive layer 1072, the auxiliary electrode layer 108, the first adhesive layer 1071, the encapsulation layer 106 and the second light-emitting electrode E2 to reach the light-transmitting hole 1031. Because the light reflected by the texture passes through many layers, in order to reduce a path of the light, a thickness of these layers needs to be small, so as to avoid multiple refractions of the light reflected by the texture, which affects accuracy of texture recognition.

For example, a value range of a thickness X1 of the cover plate 104 in the direction perpendicular to the base substrate 110 is about 100 microns to 300 microns, for example, the thickness X1 is about 150 microns, 200 microns or 250 microns, etc. A value range of a thickness X2 of the second adhesive layer 1072 in the direction perpendicular to the base substrate 110 is, for example, about 30 microns to 70 microns, for example, the thickness X2 is about 40 microns, 50 microns or 60 microns, etc. A value range of a thickness X3 of the auxiliary electrode layer 108 in the direction perpendicular to the base substrate 110 is about 90 microns to 130 microns, for example, the thickness X3 is about 100 microns, 110 microns or 120 microns, etc. A value range of a thickness X4 of the first adhesive layer 1071 in the direction perpendicular to the base substrate 110 is, for example, about 30 microns to 70 microns, for example, the thickness X4 is about 40 microns, 50 microns or 60 microns, etc. A value range of a thickness X5 of the encapsulation layer 106 in the direction perpendicular to the base substrate 110 is about 5 microns to 15 microns, for example, the thickness X5 is about 8 microns, 10 microns or 12 microns, etc.

Figure 9:
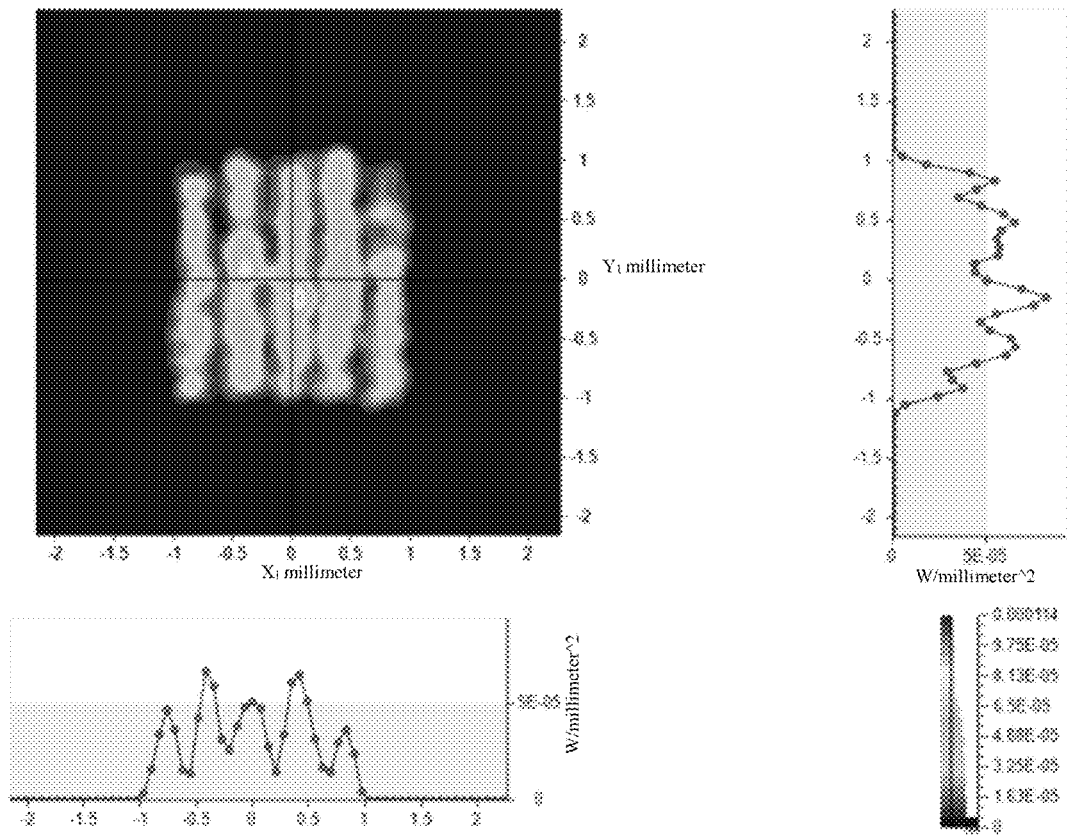
FIG. 9 is a schematic diagram of an irradiance simulation result of fingerprint recognition of a texture recognition apparatus provided by at least one embodiment of the present disclosure.

For example, FIG. 9 is a schematic diagram of an irradiance simulation result of texture recognition of a texture recognition apparatus provided by at least one embodiment of the present disclosure. As shown in FIG. 9, an optical simulation test is performed on the texture recognition apparatus of the above-described example (the example shown in FIG. 6 and FIG. 8A to FIG. 8B); it can be seen from a simulation structure that, the collimated light through the plurality of light-transmitting holes 1031 of the light shielding layer 103 accurately corresponds to the valleys and the ridges of the texture, without being cross-talked by other stray light such as ambient light; and the photosensitive element 1021 of each image sensor 102 receives light filtered by the light-transmitting holes 1031, and therefore obtains a clearer and accurate texture image, so as to implement accurate texture recognition. Therefore, the light shielding layer 103 does not shield the signal light while avoiding interference of ambient light, so as to further ensure accuracy of texture recognition.

Figure 10:
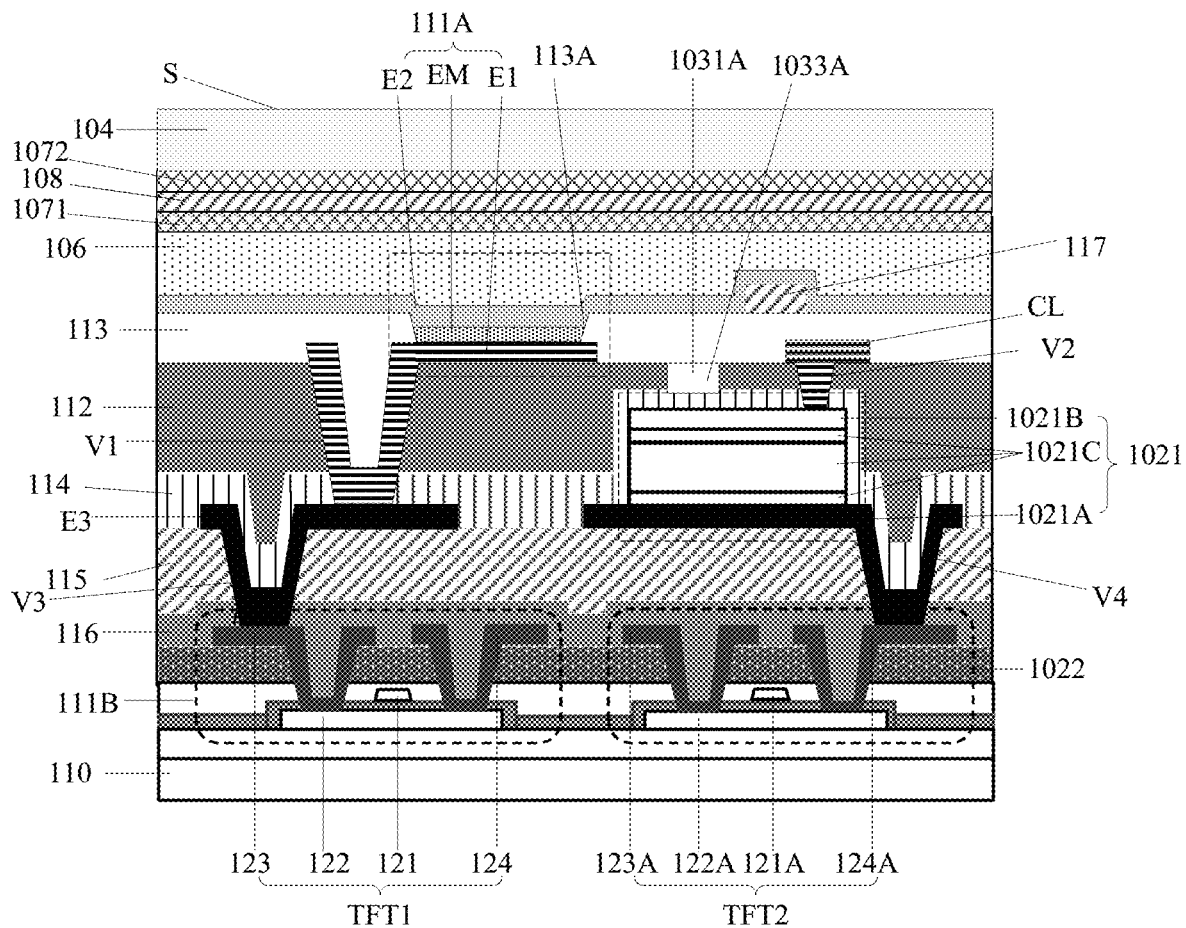
FIG. 10 is a cross-sectional schematic diagram of another texture recognition apparatus provided by at least one embodiment of the present disclosure.

For example, in other embodiments, the planarization layer 112 is configured to include a light shielding layer. FIG. 10 is a cross-sectional schematic diagram of another texture recognition apparatus provided by at least one embodiment of the present disclosure. As shown in FIG. 10, a material of the planarization layer 112 may be an organic resin material doped with black pigment to form the light shielding layer 103. The light-transmitting hole 1031A is located in the planarization layer 112; and an orthogonal projection of the light-transmitting hole 1031A on the base substrate 110 is located in an orthogonal projection of the photosensitive element 1021 on the base substrate 110. The light-transmitting hole 1031A collimates light reflected by the texture; and the photosensitive element 1021 can receive light incident into the light-transmitting hole 1031A for texture image collection.

For example, as shown in FIG. 10, the filling pattern 1033A is located in the light-transmitting hole 1031A; and when the planarization layer 112 includes the light shielding layer 103, a material of the filling pattern 1033A is the same as a material of the pixel definition layer 113. In this case, the material of the filling pattern 1033A and the material of the pixel definition layer 113 may include a transparent insulating material. The transparent insulating material is filled in the light-transmitting hole 1031 by chemical deposition or sputtering. For example, in the preparation process, the filling pattern 1033A and the pixel definition layer 113 may be formed by the same patterning process.

Figure 11:
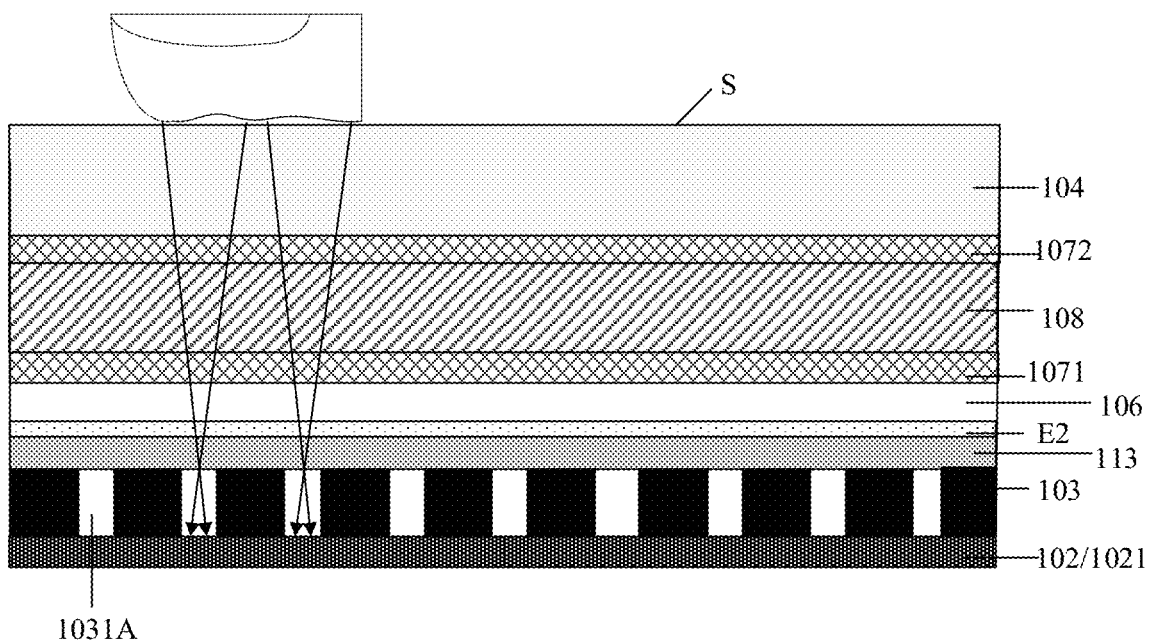
FIG. 11 is a cross-sectional schematic diagram of a texture recognition optical path of the texture recognition apparatus in FIG. 10.

For example, FIG. 11 is a schematic diagram of a texture recognition optical path of the texture recognition apparatus in FIG. 10. As shown in FIG. 11, light emitted from the plurality of light sources 101 is reflected by the texture to the plurality of light-transmitting holes 1031A. The plurality of light-transmitting holes 1031A are configured to collimate the light reflected by the texture to the direction perpendicular to the touch side surface S. The light collimated by the plurality of light-transmitting holes 1031A is received by the photosensitive element 1021 of the image sensor 102 for texture image collection. The light reflected by the texture needs to pass through the cover plate 104, the second adhesive layer 1072, the auxiliary electrode layer 108, the first adhesive layer 1071, the encapsulation layer 106, the second light-emitting electrode E2 and the pixel definition layer 113 to reach the light-transmitting hole 1031A.

Figure 12:
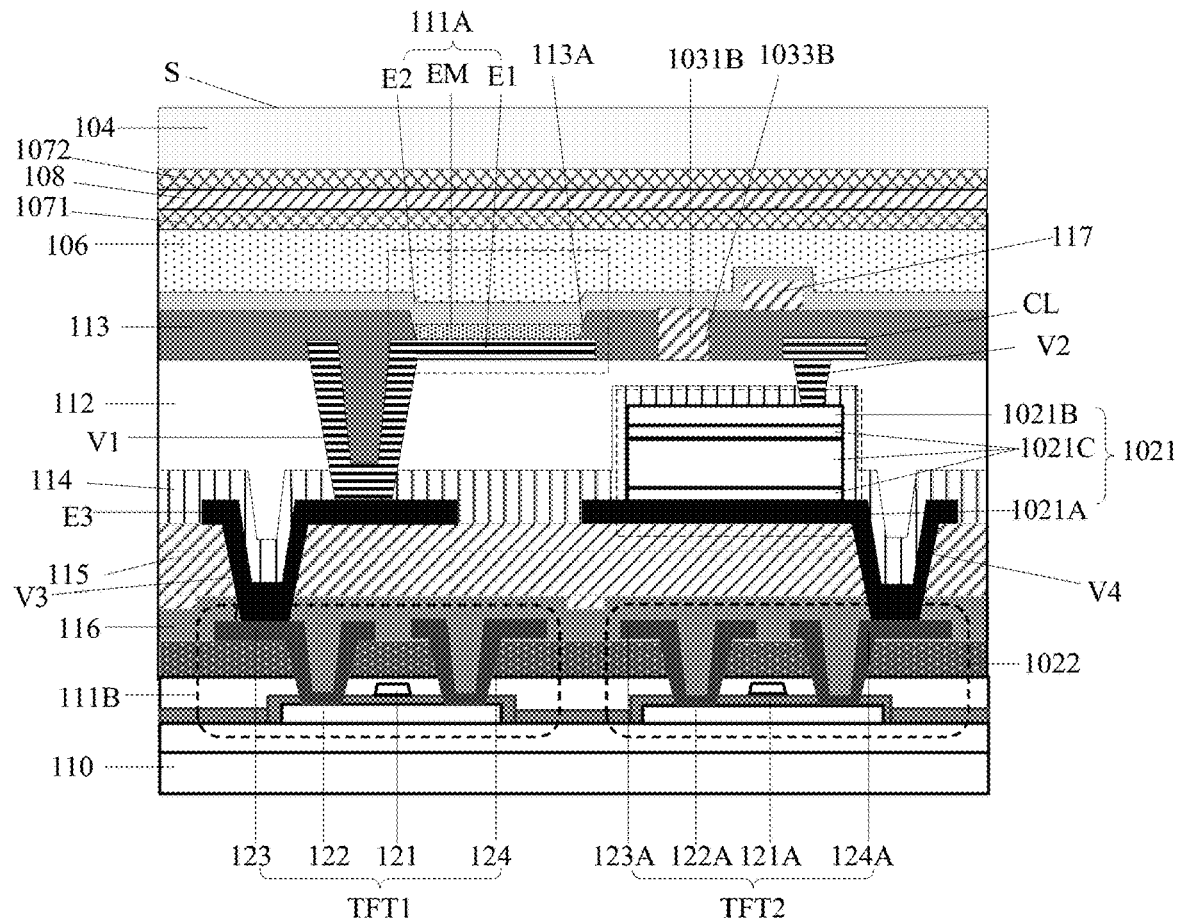
FIG. 12 is a cross-sectional schematic diagram of still another texture recognition apparatus provided by at least one embodiment of the present disclosure.

For example, in other embodiments, the pixel definition layer 113 is configured to include a light shielding layer. FIG. 12 is a cross-sectional schematic diagram of still another texture recognition apparatus provided by at least one embodiment of the present disclosure. As shown in FIG. 12, a material of the pixel definition layer 113 may be an organic resin material doped with black pigment to form the light shielding layer 103. The light-transmitting hole 1031B is located in the pixel definition layer 113; and an orthogonal projection of the light-transmitting hole 1031B on the base substrate 110 is located in an orthogonal projection of the photosensitive element 1021 on the base substrate 110. In this case, a material of the planarization layer 112 may include a transparent insulating material. The light-transmitting hole 1031B collimates the light reflected by the texture, and the collimated light passes through the planarization layer 112 and is received by the photosensitive element 1021 for texture image collection.

For example, as shown in FIG. 12, the filling pattern 1033B is located in the light-transmitting hole 1031B; and when the pixel definition layer 113 includes the light shielding layer 103, a material of the filling pattern 1033B is the same as a material of the spacer 117. The transparent insulating material is filled in the light-transmitting hole 1031B by chemical deposition or sputtering. For example, in the preparation process, the filling pattern 1033B and the spacer 117 may be formed by the same patterning process.

Figure 13:
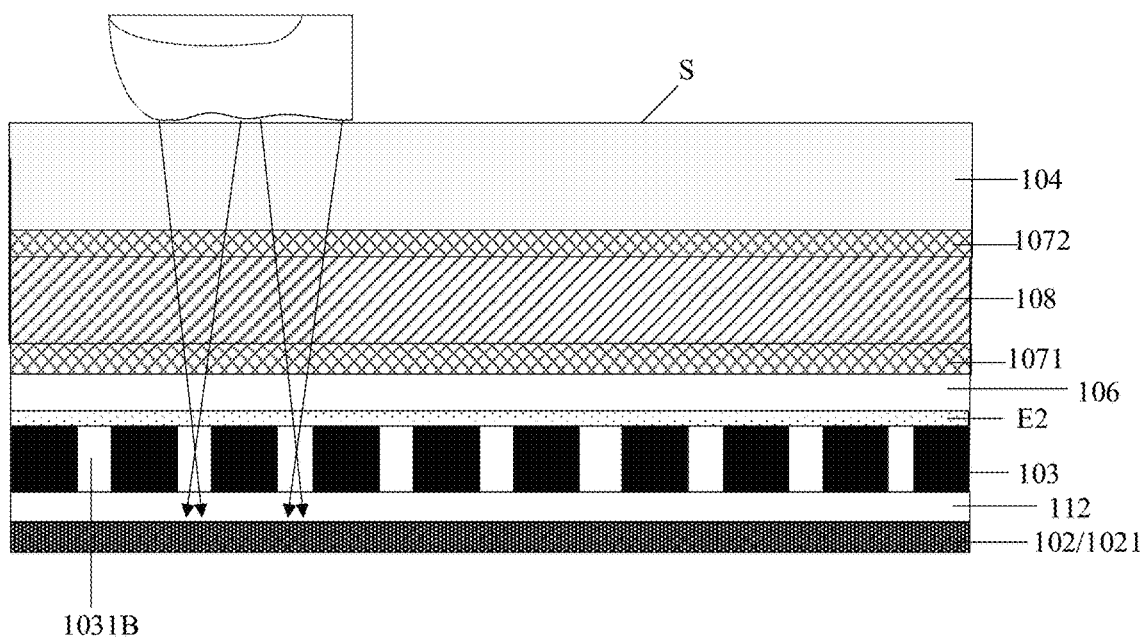
FIG. 13 is a schematic diagram of a texture recognition optical path of the texture recognition apparatus in FIG. 12.

For example, FIG. 13 is a schematic diagram of a texture recognition optical path of the texture recognition apparatus in FIG. 12. As shown in FIG. 13, light emitted from the plurality of light sources 101 is reflected by the texture to the plurality of light-transmitting holes 1031B. The plurality of light-transmitting holes 1031B are configured to collimate the light reflected by the texture to the direction perpendicular to the touch side surface S. The light collimated by the plurality of light-transmitting holes 1031B passes through the planarization layer 112 and is received by the photosensitive element 1021 of the image sensor 102 for texture image collection. The light reflected by the texture needs to pass through the cover plate 104, the second adhesive layer 1072, the auxiliary electrode layer 108, the first adhesive layer 1071, the encapsulation layer 106 and the second light-emitting electrode E2, and then reach the light-transmitting hole 1031B.

Figure 14:
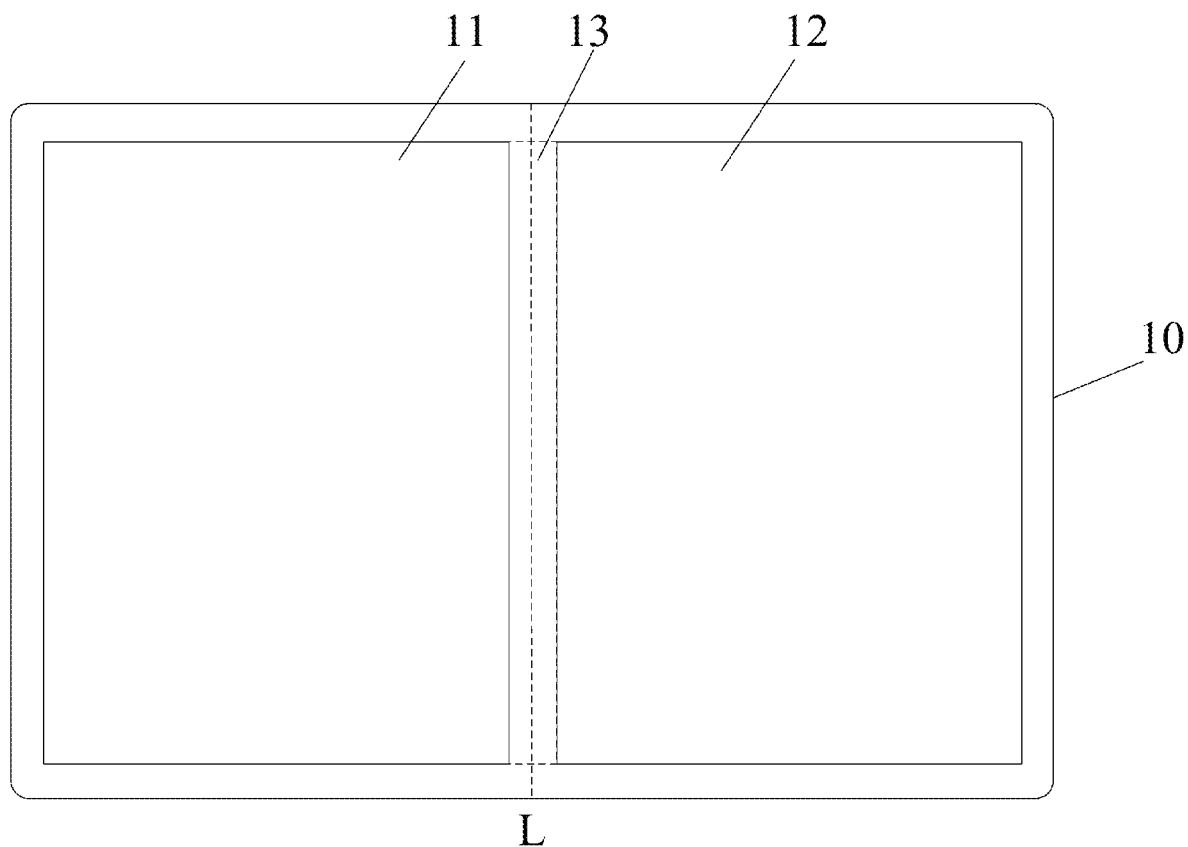
FIG. 14 is a schematic diagram of a display panel provided by at least one embodiment of the present disclosure.

For example, the display panel provided by at least one embodiment of the present disclosure is a foldable display panel. For example, FIG. 14 is a schematic diagram of a display panel provided by at least one embodiment of the present disclosure. As shown in FIG. 14, the display panel 10 includes a first display region 11, a second display region 12, and a folding region 13 located between the first display region 11 and the second display region 12. The light source array, the image sensor array and the light shielding layer 103 according to the above-described embodiments are located in the first display region 11 and the second display region 12, that is, the sub-pixel and the image sensor 102 in the first display region 11 and the second display region 12 may be arranged in the manner shown in FIG. 8B or FIG. 8C; and each position of the first display region 11 and the second display region 12 has a texture recognition function. When a texture touches the touch side surface S of the display panel, some of the sub-pixels located in the first display region 11 and the second display region 12 are lit up for forming a point-shaped photosensitive light source, a line-shaped photosensitive light source, or a patterned photosensitive light source, etc.; or all sub-pixels located in the first display region 11 and the second display region 12 are lit up, so as to implement full-screen texture recognition. The display panel 10 is configured to implement a folding function through the folding region 13, for example, the display panel 10 can be folded along a line L in the folding region 13, so that a touch side surface S located in the first display region 11 is opposite to a touch side surface S located in the second display region 12. The display panel 10 is in an unfolded state in FIG. 14, and will be in a folded state after the display panel 10 is folded through the folding region 13.

For example, the display panel 10 may be an organic light emitting diode (OLED) display panel or a quantum dot light emitting diode (QLED) display panel, etc., the embodiments of the present disclosure are not limited in this aspect. From aspects of thickness, the display panel 10 may be an ultrathin display panel. The OLED display panel may be, for example, a flexible OLED display panel. For example, the OLED display panel and the QLED display panel have self-luminous properties, and luminescence of display pixel units thereof can also be controlled or modulated as required, which can facilitate texture collection and help improve device integration.

For example, in addition to the sub-pixel array, the display panel 10 further includes signal lines (including gate lines, data lines, detection lines, etc.) for supplying electrical signals (including scan signals, data signals, detection signals, etc.), for example, a luminous state of the light-emitting device can be controlled by a driving circuit to achieve the lighting of a sub-pixel. For example, the display panel may also have other functional layers; and related art may be referred to for these functional layers, which will not be limited by the embodiments of the present disclosure.

At least one embodiment of the present disclosure further provides an electronic apparatus, the electronic apparatus includes any one of the above-described texture recognition apparatuses. The electronic apparatus may be a mobile phone, a tablet personal computer, a monitor, a laptop, and any other product or component having a texture recognition function, which will not be specifically limited by the embodiments of the present disclosure.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should understood that, in the case in which a component such as a layer, film, region, substrate or the like is referred to be "on" or "under" another component, it may be directly on or under the another component or a component is interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A texture recognition apparatus, having a touch side surface, and comprising:
a light source array, comprising a plurality of light sources;
an image sensor array, comprising a plurality of image sensors, wherein the plurality of image sensors are configured to be able to receive light emitted from the plurality of light sources and reflected by a texture to the plurality of image sensors for texture image collection, each of the plurality of image sensors comprises a photosensitive element; and
a light shielding layer, on a light incident side of the image sensor array, wherein the light shielding layer comprises a plurality of light-transmitting holes, the plurality of light-transmitting holes are configured to collimate light emitted by the plurality of light sources and reflected by the texture to a direction perpendicular to the touch side surface;
wherein in the direction perpendicular to the touch side surface, a photosensitive element in each of the plurality of image sensors at least partially overlaps with at least one of the plurality of light-transmitting holes,
wherein the texture recognition apparatus further comprises:
a display panel, wherein the display panel comprises an array substrate; the array substrate comprises a base substrate and a sub-pixel array on the base substrate; the sub-pixel array comprises a plurality of sub-pixels,
wherein the light source array comprises the sub-pixel array; and the plurality of light sources comprise the plurality of sub-pixels,
wherein each of the plurality of sub-pixels comprises a pixel driving circuit on the base substrate; the pixel driving circuit comprises a thin film transistor; and each of the plurality of image sensors further comprises a switch transistor on the base substrate, the thin film transistor and the switch transistor are in a same layer,
wherein the photosensitive element is on a side of the switch transistor away from the base substrate; the photosensitive element comprises a first electrode, a second electrode and a semiconductor layer between the first electrode and the second electrode; the first electrode is electrically connected with the switch transistor;
the array substrate further comprises a planarization layer on a side of the photosensitive element away from the base substrate; and the planarization layer has a first via and a second via;
each of the plurality of sub-pixels further comprises a light-emitting device; the light-emitting device is on a side of the planarization layer away from the base substrate; the light-emitting device comprises a first light-emitting electrode, a second light-emitting electrode, and a light-emitting layer between the first light-emitting electrode and the second light-emitting electrode; the first light-emitting electrode is electrically connected with the thin film transistor at least through the first via;
the array substrate further comprises a connecting line in a same layer as the first light-emitting electrode; and the connecting line is electrically connected with the second electrode of the photosensitive element through the second via.

2. The texture recognition apparatus according to claim 1, wherein the plurality of light-transmitting holes comprise a plurality of first light-transmitting holes arranged in an array; and the plurality of image sensors comprise a first image sensor,
in the direction perpendicular to the touch side surface, a photosensitive element of the first image sensor at least partially overlaps with the plurality of first light-transmitting holes.

3. The texture recognition apparatus according to claim 2, wherein a value range of a diameter w of each of the plurality of first light-transmitting holes is 1 micron to 10 microns; and
a value range of a height H of each of the plurality of first light-transmitting holes in the direction perpendicular to the touch side surface is 4 microns to 50 microns.

4. The texture recognition apparatus according to claim 3, wherein a value range of an aperture ratio H/w of each of the plurality of first light-transmitting holes is 1 to 10.

5. The texture recognition apparatus according to claim 2, wherein a separation distance between two adjacent light-transmitting holes of the plurality of first light-transmitting holes is 2 microns to 10 microns.

6. The texture recognition apparatus according to claim 1, wherein the light shielding layer comprises a plurality of light shielding patterns arranged in an array,
in the direction perpendicular to the touch side surface, the plurality of light shielding patterns are in one-to-one correspondence and at least partially overlap with the plurality of image sensors; and the plurality of light-transmitting holes are distributed in the plurality of light shielding patterns.

7. The texture recognition apparatus according to claim 1, wherein the array substrate further comprises a pixel definition layer on a side of the first light-emitting electrode and the connecting line away from the base substrate;
the pixel definition layer has a first opening exposing the first light-emitting electrode; and the light-emitting layer and the second light-emitting electrode are at least formed in the first openings.

8. The texture recognition apparatus according to claim 7, wherein the array substrate further comprises a plurality of filling patterns respectively in the plurality of light-transmitting holes,
a material of the plurality of filling patterns comprises a transparent insulating material.

9. The texture recognition apparatus according to claim 8, wherein the planarization layer is configured to comprise the light shielding layer.

10. The texture recognition apparatus according to claim 9, wherein a material of the pixel definition layer is same as the material of the plurality of filling patterns.

11. The texture recognition apparatus according to claim 8, wherein the pixel definition layer is configured to comprise the light shielding layer; or the planarization layer and the pixel definition layer are configured to collectively comprise the light shielding layer.

12. The texture recognition apparatus according to claim 11, wherein the array substrate further comprises a spacer on a side of the pixel definition layer away from the base substrate, a material of the spacer is same as the material of the plurality of filling patterns.

13. The texture recognition apparatus according to claim 1, wherein the array substrate further comprises a cover plate on a side of the second light-emitting electrode away from the base substrate, a value range of a thickness of the cover plate in a direction perpendicular to the base substrate is 100 microns to 300 microns.

14. The texture recognition apparatus according to claim 13, wherein the display panel comprises a first display region, a second display region, and a folding region between the first display region and the second display region, the light source array, the image sensor array and the light shielding layer are in the first display region and the second display region, and the display panel is configured to implement a folding function through the folding region, so that a touch side surface in the first display region is opposite to a touch side surface in the second display region.

15. An electronic apparatus, comprising the texture recognition apparatus according to claim 1.

* * * * *